United States Patent
Hiyoshi

(10) Patent No.: US 7,196,458 B2
(45) Date of Patent: Mar. 27, 2007

(54) LAYERED PIEZOELECTRIC ELEMENT REALIZING STABLE OPERATING CHARACTERISTIC FOR HIGH QUALITY IMAGE RECORDING

(75) Inventor: Takayuki Hiyoshi, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 384 days.

(21) Appl. No.: 10/493,365

(22) PCT Filed: Feb. 6, 2003

(86) PCT No.: PCT/JP03/01261

§ 371 (c)(1),
(2), (4) Date: Apr. 23, 2004

(87) PCT Pub. No.: WO03/071612

PCT Pub. Date: Aug. 28, 2003

(65) Prior Publication Data
US 2005/0017601 A1    Jan. 27, 2005

(30) Foreign Application Priority Data
Feb. 25, 2002  (JP)  ............................. 2002-047371

(51) Int. Cl.
*B41J 2/04*  (2006.01)
*H01L 41/083*  (2006.01)

(52) U.S. Cl. .................. 310/365; 310/366; 347/68; 347/70; 347/71

(58) Field of Classification Search ................. 310/328, 310/364–366, 363; 347/72, 68–71; *B41J 2/045*
See application file for complete search history.

(56) References Cited

U.S. PATENT DOCUMENTS

| 6,409,320 B1 * | 6/2002 | Kurihara et al. .............. 347/68 |
| 6,766,817 B2 | 7/2004 | Da Silva |
| 2002/0008441 A1 | 1/2002 | Nariai |

FOREIGN PATENT DOCUMENTS

| JP | 09300618 | 11/1997 |
| JP | 10286951 | * 10/1998 |
| JP | 2000177120 | 6/2000 |
| JP | 2000325882 | 11/2000 |
| JP | 20022316411 | 10/2002 |

\* cited by examiner

Primary Examiner—Tom Dougherty
Assistant Examiner—J. Aguirrechea
(74) Attorney, Agent, or Firm—Cooper & Dunham LLP

(57) ABSTRACT

A layered piezoelectric element includes a plurality of driving parts divided by grooves and non-driving parts formed at both ends of the array of the driving parts. The driving parts and the non-driving parts include the alternate layers of piezoelectric layers and internal electrodes. The common electrode of the driving parts is extended from the non-driving parts. The capacitance C (F) of each driving part, the number of the driving parts n, and the resistance R (Ω) between the non-driving parts satisfy $R \leq 8 \times 10^{-6}/n/C$.

29 Claims, 15 Drawing Sheets

LAYERED PIEZOELECTRIC ELEMENT REALIZING STABLE OPERATING CHARACTERISTIC FOR HIGH QUALITY IMAGE RECORDING

TECHNICAL FIELD

The present invention generally relates to image recording, and more particularly to a layered piezoelectric element, a method of manufacturing the same, a piezoelectric actuator, a liquid droplet ejecting head, and an ink-jet recording apparatus.

BACKGROUND ART

An ink-jet recording apparatus employed as an image recording apparatus (an imaging apparatus) such as a printer, a facsimile machine, a copier, or a plotter includes an ink-jet head as a liquid droplet ejecting head including nozzles for ejecting ink droplets, liquid chambers (also referred to as ink channels, ejection chambers, pressure chambers, pressure liquid chambers, or channels) communicating with the nozzles, and driving parts (pressure generating parts) for pressurizing ink in the liquid chambers. Liquid droplet ejecting heads include a head ejecting droplets of a liquid resist and a head ejecting droplets of a DNA sample in addition to an ink-jet head, but the following description is given based mainly on the ink-jet head as the liquid droplet ejecting head.

As an ink-jet head, a so-called piezoelectric ink-jet head is well known. The piezoelectric ink-jet head employs a piezoelectric body, particularly a layered piezoelectric body of alternate layers of piezoelectric layers and internal electrodes, as a pressure generation part generating pressure for pressurizing ink in a liquid chamber. An elastically deformable diaphragm forming a wall face of the liquid chamber is deformed by the displacement of the layered piezoelectric element in the d33 direction, so that the volume/pressure inside the liquid chamber is changed, thereby ejecting ink droplets.

Japanese Laid-Open Patent Application No. 10-286951 discloses an ink-jet head using such a layered piezoelectric element. In this ink-jet head, grooves are formed in part of a layered piezoelectric element having an external electrode formed as individual electrodes on one side and a common external electrode formed on the other side, so that a plurality of driving parts (driving channels) are formed between non-driving parts formed on both ends. The common electrode of the layered piezoelectric element extends from the non-driving parts on both ends in the directions in which the driving parts are arranged.

In recent years, the ink-jet recording apparatus has been required to perform image recording with higher quality at higher speeds. In order to increase recording speed, the number of nozzles of a head is increased in the secondary scanning direction so that a single scan of a carriage in the primary scanning direction has a larger width in the secondary scanning direction in printing.

However, in the case of extending the common electrode of the driving parts of the layered piezoelectric element from the non-driving parts on both longitudinal ends thereof as in the above-described ink-jet head, when the layered piezoelectric element is elongated so as to increase the number of driving parts (driving channels) for the purpose of increasing recording speed, the length of conduction from the common electrode extension parts (non-driving parts) to each of the driving channels increases as the number of driving channels increases. As a result, the resistance of the common electrode increases. Particularly, in the case of forming a plurality of driving parts by performing half-cutting on the layered piezoelectric element, the ungrooved remaining part serves as the common external electrode, so that the long narrow part increases the resistance of the common electrode.

The time constant of a driving voltage applied to a driving channel in the case of driving all the driving channels is different from that in the case of driving only one of the driving channels.

The time constant of the driving voltage increases as the number of driving channels increases. Further, the degree of such increase becomes greater as the resistance of the common electrode increases.

When the time constant of the driving voltage thus changes, an ink droplet ejection characteristic, particularly ink droplet velocity, changes to vary the point of impact of an ink droplet. Therefore, when there is a large difference between the time constants of the foregoing two cases, great degradation is caused in image quality especially in the case of printing a high-density image of approximately 600 dpi.

Therefore, in the conventional ink-jet head using a layered piezoelectric element, there is the problem that high image quality cannot be obtained due to the large resistance of the common electrode especially in the case of printing a high-density image of approximately 600 dpi.

DISCLOSURE OF THE INVENTION

Accordingly, it is a general object of the present invention to realize image recording in which the above-described disadvantage is eliminated.

A more specific object of the present invention is to provide a layered piezoelectric element reducing the difference between the time constant of a driving voltage in the case of driving all channels and that in the case of driving only one channel, and a method of manufacturing the same.

Another more specific object of the present invention is to provide a piezoelectric actuator having a stable operating characteristic, a liquid droplet ejecting head having a stable ejection characteristic, and an ink-jet recording apparatus capable of high-quality recording.

The above objects of the present invention are achieved by a layered piezoelectric element including: a plurality of driving parts divided by grooves, the driving parts including alternate layers of piezoelectric layers and internal electrodes; and non-driving parts formed at both ends of an array of the driving parts, the non-driving parts including the alternate layers of the piezoelectric layers and the internal electrodes, wherein a common electrode of the driving parts is extended from the non-driving parts, and a capacitance C (F) of each of the driving parts, the number of the driving parts n, and a resistance R ($\Omega$) between the non-driving parts satisfy $R \leq 8 \times 10^{-6}/nC$.

The above-described layered piezoelectric element satisfies the expression $R \leq 8 \times 10^{-6}/nC$. Therefore, the difference in its operating characteristic between the case of driving all channels and the case of driving one channel is reduced.

The above objects of the present invention are also achieved by a layered piezoelectric element including: a plurality of driving parts divided by grooves, the driving parts including alternate layers of piezoelectric layers and internal electrodes; non-driving parts formed at both ends of an array of the driving parts, the non-driving parts including the alternate layers of the piezoelectric layers and the internal electrodes; and an internal electrode for conduction connected to a common external electrode of the driving parts and undivided by the grooves, wherein a common electrode of the driving parts is extended from the non-driving parts.

The above-described layered piezoelectric element includes the internal electrode for conduction connected to the common external electrode of the driving parts. Therefore, the common electrode resistance is decreased, so that the difference in its operating characteristic between the case of driving all channels and the case of driving one channel is reduced.

The above objects of the present invention are also achieved by a layered piezoelectric element including: a plurality of driving parts divided by grooves, the driving parts including alternate layers of piezoelectric layers and internal electrodes; non-driving parts formed at both ends of an array of the driving parts, the non-driving parts including the alternate layers of the piezoelectric layers and the internal electrodes; and an external electrode for conduction connected to a common external electrode of the driving parts, the external electrode for conduction being formed on a surface of the layered piezoelectric layer which surface is undivided by the grooves, wherein a common electrode of the driving parts is extended from the non-driving parts.

The above-described layered piezoelectric element includes the external electrode for conduction connected to the common external electrode of the driving parts. Therefore, the common electrode resistance is decreased, so that the difference in its operating characteristic between the case of driving all channels and the case of driving one channel is reduced.

The above objects of the present invention are also achieved by a method of manufacturing a layered piezoelectric element including a plurality of driving parts divided by grooves, non-driving parts formed at both ends of an array of the driving parts, and an internal electrode for conduction connected to a common external electrode of the driving parts and undivided by the grooves, the driving parts and the non-driving parts including alternate layers of piezoelectric layers and internal electrodes, the driving parts having a common electrode extended from the non-driving parts, the method including the steps of (a) fixing a member including a dummy part to a base, the dummy part being formed of a piezoelectric layer to have a shape substantially symmetrical to a shape of a group of the internal electrodes of the alternate layers in a direction in which the alternate layers are formed, and (b) removing the dummy part from the member.

According to the above-described method, the layered piezoelectric element of the present invention can be manufactured suitably with a reduced warp.

The above objects of the present invention are also achieved by a piezoelectric actuator including a movable part and a layered piezoelectric element deforming the movable part, the layered piezoelectric element including: a plurality of driving parts divided by grooves, the driving parts including alternate layers of piezoelectric layers and internal electrodes; and non-driving parts formed at both ends of an array of the driving parts, the non-driving parts including the alternate layers of the piezoelectric layers and the internal electrodes, wherein a common electrode of the driving parts is extended from the non-driving parts, and a capacitance C (F) of each of the driving parts, the number of the driving parts n, and a resistance R ($\Omega$) between the non-driving parts satisfy $R \leq 8 \times 10^{-6}/n/C$.

The above objects of the present invention are also achieved by a piezoelectric actuator including a movable part and a layered piezoelectric element deforming the movable part, the layered piezoelectric element including: a plurality of driving parts divided by grooves, the driving parts including alternate layers of piezoelectric layers and internal electrodes; non-driving parts formed at both ends of an array of the driving parts, the non-driving parts including the alternate layers of the piezoelectric layers and the internal electrodes; and an internal electrode for conduction connected to a common external electrode of the driving parts and undivided by the grooves, wherein a common electrode of the driving parts is extended from the non-driving parts.

The above objects of the present invention are also achieved by a piezoelectric actuator including a movable part and a layered piezoelectric element deforming the movable part, the layered piezoelectric element including: a plurality of driving parts divided by grooves, the driving parts including alternate layers of piezoelectric layers and internal electrodes; non-driving parts formed at both ends of an array of the driving parts, the non-driving parts including the alternate layers of the piezoelectric layers and the internal electrodes; and an external electrode for conduction connected to a common external electrode of the driving parts, the external electrode for conduction being formed on a surface of the layered piezoelectric layer which surface is undivided by the grooves, wherein a common electrode of the driving parts is extended from the non-driving parts.

The above-described piezoelectric actuators each include the layered piezoelectric element of the present invention deforming the movable part. Therefore, the above-described piezoelectric actuators can obtain a stable operating characteristic with reduced variation.

The above objects of the present invention are also achieved by a liquid droplet ejecting head including a piezoelectric actuator pressurizing a liquid chamber communicating with a nozzle so as to eject a liquid droplet from the nozzle, the piezoelectric actuator including a layered piezoelectric element, the layered piezoelectric element including: a plurality of driving parts divided by grooves, the driving parts including alternate layers of piezoelectric layers and internal electrodes; and non-driving parts formed at both ends of an array of the driving parts, the non-driving parts including the alternate layers of the piezoelectric layers and the internal electrodes, wherein a common electrode of the driving parts is extended from the non-driving parts, and a capacitance C (F) of each of the driving parts, the number of the driving parts n, and a resistance R ($\Omega$) between the non-driving parts satisfy $R \leq 8 \times 10^{-6}/n/C$.

The above objects of the present invention are also achieved by a liquid droplet ejecting head including a piezoelectric actuator pressurizing a liquid chamber communicating with a nozzle so as to eject a liquid droplet from the nozzle, the piezoelectric actuator including a layered piezoelectric element, the layered piezoelectric element including: a plurality of driving parts divided by grooves, the driving parts including alternate layers of piezoelectric layers and internal electrodes; non-driving parts formed at both ends of an array of the driving parts, the non-driving parts comprising the alternate layers of the piezoelectric layers and the internal electrodes; and an internal electrode for conduction connected to a common external electrode of the driving parts and undivided by the grooves, wherein a common electrode of the driving parts is extended from the non-driving parts.

The above objects of the present invention are also achieved by a liquid droplet ejecting head including a piezoelectric actuator pressurizing a liquid chamber communicating with a nozzle so as to eject a liquid droplet from the nozzle, the piezoelectric actuator including a layered piezoelectric element, the layered piezoelectric element including: a plurality of driving parts divided by grooves, the driving parts comprising alternate layers of piezoelectric layers and internal electrodes; non-driving parts formed at both ends of an array of the driving parts, the non-driving parts including the alternate layers of the piezoelectric layers and the internal electrodes; and an external electrode for conduction connected to a common external electrode of the driving parts, the external electrode for conduction being formed on a surface of the layered piezoelectric layer which surface is undivided by the grooves, wherein a common electrode of the driving parts is extended from the non-driving parts.

The above-described liquid droplet ejecting heads each include the piezoelectric actuator of the present invention pressurizing liquid inside the liquid chamber. Therefore, the above-described liquid droplet ejecting heads can obtain a stable operating characteristic with reduced variation so as to be capable of performing image recording with high quality.

The above objects of the present invention are also achieved by an ink-jet recording apparatus including an ink-jet head ejecting an ink droplet, the ink-jet head including a piezoelectric actuator pressurizing a liquid chamber communicating with a nozzle so as to eject the ink droplet from the nozzle, the piezoelectric actuator including a layered piezoelectric element, the layered piezoelectric element including: a plurality of driving parts divided by grooves, the driving parts including alternate layers of piezoelectric layers and internal electrodes; and non-driving parts formed at both ends of an array of the driving parts, the non-driving parts including the alternate layers of the piezoelectric layers and the internal electrodes, wherein a common electrode of the driving parts is extended from the non-driving parts, and a capacitance C (F) of each of the driving parts, the number of the driving parts n, and a resistance R ($\Omega$) between the non-driving parts satisfy $R \leq 8 \times 10^{-6}/n/C$.

The above objects of the present invention are also achieved by an ink-jet recording apparatus including an ink-jet head ejecting an ink droplet, the ink-jet head including a piezoelectric actuator pressurizing a liquid chamber communicating with a nozzle so as to eject the ink droplet from the nozzle, the piezoelectric actuator including a layered piezoelectric element, the layered piezoelectric element including: a plurality of driving parts divided by grooves, the driving parts including alternate layers of piezoelectric layers and internal electrodes; non-driving parts formed at both ends of an array of the driving parts, the non-driving parts including the alternate layers of the piezoelectric layers and the internal electrodes; and an internal electrode for conduction connected to a common external electrode of the driving parts and undivided by the grooves, wherein a common electrode of the driving parts is extended from the non-driving parts.

The above objects of the present invention are also achieved by an ink-jet recording apparatus including an ink-jet head ejecting an ink droplet, the ink-jet head including a piezoelectric actuator pressurizing an ink chamber communicating with a nozzle so as to eject the ink droplet from the nozzle, the piezoelectric actuator including a layered piezoelectric element, the layered piezoelectric element including: a plurality of driving parts divided by grooves, the driving parts including alternate layers of piezoelectric layers and internal electrodes; non-driving parts formed at both ends of an array of the driving parts, the non-driving parts including the alternate layers of the piezoelectric layers and the internal electrodes; and an external electrode for conduction connected to a common external electrode of the driving parts, the external electrode for conduction being formed on a surface of the layered piezoelectric layer which surface is undivided by the grooves, wherein a common electrode of the driving parts is extended from the non-driving parts.

The above-described ink-jet recording apparatuses each include the liquid (ink) droplet ejecting head of the present invention. Therefore, the above-described ink-jet recording apparatuses can perform stable image recording with high quality.

The above objects of the present invention are further achieved by an ink-jet recording apparatus including an ink-jet head, the ink-jet head including a layered piezoelectric element pressurizing a liquid chamber so as to eject an ink droplet therefrom, the layered piezoelectric element including: a plurality of driving parts divided by grooves, the driving parts including alternate layers of piezoelectric layers and internal electrodes; and non-driving parts formed at both ends of an array of the driving parts, the non-driving parts including the alternate layers of the piezoelectric layers and the internal electrodes, wherein a common electrode of the driving parts is extended from the non-driving parts, and a difference between a time constant of a driving voltage applied to the layered piezoelectric element in a case of driving all of the driving parts and a time constant of a driving voltage applied to the layered piezoelectric element in a case of driving one of the driving parts is smaller than or equal to 2 μsec.

The above-described ink-jet recording apparatus also reduces the difference in its droplet ejection characteristics between the case of driving all channels and the case of driving one channel so as to be capable of performing image recording with high quality.

BRIEF DESCRIPTION OF THE DRAWINGS

Other objects, features and advantages of the present invention will become more apparent from the following detailed description when read in conjunction with the accompanying drawings, in which.

BEST MODE FOR CARRYING OUT THE INVENTION

A description will now be given, with reference to the accompanying drawings, of embodiments of the present invention.

First Embodiment

Figure 1:
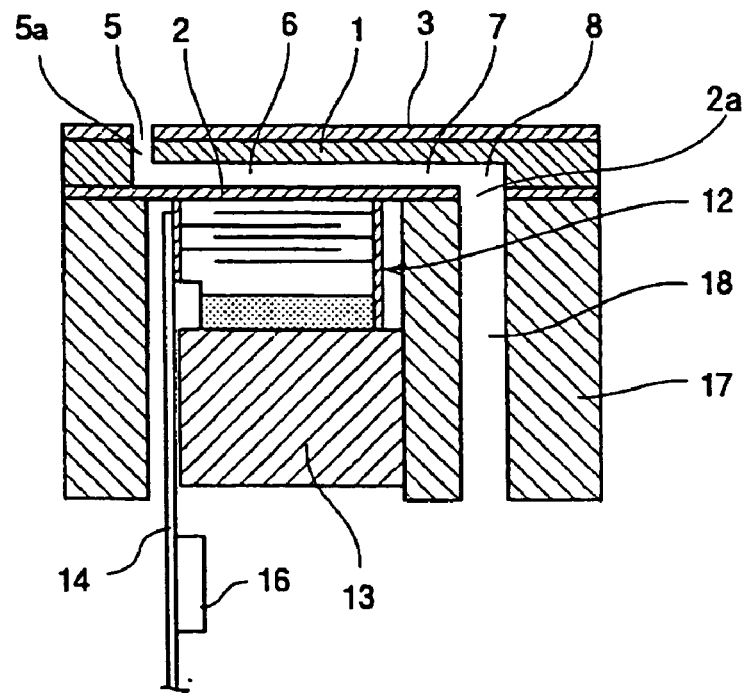
FIG. 1 is a sectional view of an ink-jet head taken along directions in which a pressure liquid chamber thereof extends according to a first embodiment of the present invention.

First, a description will be given, with reference to FIG. 1, of an ink-jet head as a liquid droplet ejecting head according to a first embodiment of the present invention. FIG. 1 is a sectional view of the ink-jet head taken along the directions in which the pressure liquid chamber 6 thereof extends.

The ink-jet head includes a channel substrate (liquid chamber substrate) 1 formed of a single-crystal silicon substrate, a diaphragm 2 joined to the lower face of the channel substrate 1, and a nozzle plate 3 joined to the upper face of the channel substrate 1, thereby forming the pressure liquid chambers 6 and a common liquid chamber 8. The pressure liquid chambers 6 are channels (ink liquid chambers) with which nozzles 5 ejecting ink droplets communicate through ink communicating channels 5a. The common liquid chamber 8 supplies ink to the pressure liquid chambers 6 via ink supply channels 7 serving as fluid resistance parts.

Through holes serving as the ink communicating channels 5a and concave parts serving as the pressure liquid chambers 6, the ink supply channels 7, and the common liquid chamber 8 are formed in the channel substrate 1 by performing anisotropic etching on a single-crystal silicon substrate of a (110) crystal plane using an alkaline etchant such as a potassium hydroxide (KOH) aqueous solution.

The diaphragm 2 is formed of a plate of metal such as nickel. The diaphragm 2 may also be formed of a resin member or a layered member of resin and metal members.

The nozzles 5 of 10 through 30 μm are formed in the nozzle plate 3 so as to correspond to the pressure liquid chambers 6. The nozzle plate 3 is bonded to the channel substrate 1 with an adhesive agent. The nozzle plate 3 may be formed of metal such as stainless steel or nickel, a combination of metal and resin such as a polyimide resin film, silicon, or a combination of these materials. A water repellent film is formed on the nozzle surface of the nozzle plate 3 by a well-known method such as plating or water repellent coating in order to ensure repellence against ink. The nozzle surface refers to a surface of the nozzle plate 3 in the direction in which ink is ejected. The nozzle surface may also be referred to as an ejection surface.

A layered piezoelectric element 12 is joined to the external face of the diaphragm 2 so that individual piezoelectric element parts of the layered piezoelectric element 12 correspond to the pressure liquid chambers 6. The external face refers to a face of the diaphragm 2 on the opposite side from the pressure liquid chambers 6. The diaphragm 2 and the layered piezoelectric element 12 form a piezoelectric actuator deforming the diaphragm 2 that is a movable part.

The layered piezoelectric element 12 has a first face on one side joined to the diaphragm 2 and a second face on the opposite side joined and fixed to a base 13 by an adhesive agent. Further, a side face of the layered piezoelectric element 12 is connected to an FPC (flexible printed circuit) cable 14 for supplying driving waveforms to the layered piezoelectric element 12.

In this embodiment, the individual layered piezoelectric element parts corresponding to the respective pressure liquid chambers 6 are formed by forming slits in the long layered piezoelectric element 12. In this specification, "the overall length of a piezoelectric element" refers to the length of the original long layered piezoelectric element 12 from which the individual layered piezoelectric element parts are formed.

In this embodiment, ink inside the pressure liquid chambers 6 may be pressurized by using the displacement of the layered piezoelectric element 12 in the d33 direction or in the d31 direction as its piezoelectric direction.

As previously described, the layered piezoelectric element 12 has the second face joined and fixed to the base 13 by an adhesive agent. The FPC cable 14 is joined by an adhesive agent to a face of the base 13 which face is perpendicular to the face thereof joined to the layered piezoelectric element 12. The FPC cable 14 is further soldered directly to individual external electrodes 24 of the layered piezoelectric element 12.

It is preferable to use metal as material for the base 13. By using metal as material for the base 13, heat storage resulting from self-heating of the layered piezoelectric element 12 can be prevented from occurring. The layered piezoelectric element 12 is joined to the base 13 by an adhesive agent. As the number of channels increases, however, temperature rises near 100° C. due to self-heating of the layered piezoelectric element 12 so as to reduce the joining strength significantly. Further, the self-heating of the layered piezoelectric element 12 increases temperature inside the ink-jet head so as to increase ink temperature. The increase in ink temperature reduces ink viscosity, thus significantly affecting the ink ejection characteristic of the ink-jet head. Accordingly, by preventing the occurrence of heat storage resulting from the self-heating of the layered piezoelectric element 12 by forming the base 13 of a metal material, degradation of the ejection characteristic of the ink-jet head due to decrease in the joining strength and the ink viscosity can be prevented.

When the base 13 has a large liner expansion coefficient, the adhesive agent may peel off at the joining interface between the base 13 and the layered piezoelectric element 12 at high or low temperatures. As to the conventional piezoelectric element, there seldom exists the problem of peeling off from the base 13 due to a difference in temperature caused by environmental variation since the piezoelectric element is shorter in overall length. This problem has been made obvious by using a piezoelectric element that has approximately 40 nozzles at 300 dpi and is approximately 30 through 40 mm in overall length.

Accordingly, it is preferable to use a material having a linear expansion coefficient of 10E-6° C. or lower for the base 13. By limiting linear expansion coefficients to this range, the base 13 is prevented from peeling off from the piezoelectric element 12 at the joining interface therewith due to a difference in temperature resulting from environmental variation. It has been confirmed that it is very effective in preventing peeling at the joining interface with a piezoelectric element to set the linear expansion coefficient of each component joined thereto to a value lower than or equal to 10E-6° C.

The FPC cable 14 includes a plurality of driver ICs 16 for applying driving waveforms (electrical signals) to drive the corresponding channels (corresponding to the pressure liquid chambers 6). By providing the driver ICs 16 to the FPC cable 14, electrical signal setting can be performed independently in each of the driver ICs 16. This facilitates correction of variations in the displacement characteristics of the driving channels of the layered piezoelectric element 12.

As the piezoelectric element becomes greater in length, it has been made obvious that variations in the displacements of the channels become greater. Accordingly, by providing the driver ICs 16 to the FPC cable 14, a variation in the displacement of the layered piezoelectric element 12 is corrected by voltage in the channel directions (in which the individual layered piezoelectric element parts are arranged), thereby realizing a uniform ejection characteristic.

Further, a frame 17 is joined to the periphery of the diaphragm 2 by an adhesive agent. An ink supply channel 18 for supplying ink from the outside to the common liquid chamber 8 is formed in the frame 17 across at least the base 13 from the driver ICs 16. The ink supply channel 18 communicates with the common liquid chamber 8 via a through hole 2a of the diaphragm 2.

The ink supply channel 18, the common liquid chamber 8, and the fluid resistance parts 7 are thus arranged on the opposite side from the driver ICs 16 so that ink can be supplied from the opposite side from the FPC cable 14 connected to the layered piezoelectric element 12, thereby preventing a rise in ink temperature due to heating of the driver ICs 16.

As previously described, the heat of the driver ICs 16, which may vary depending on the number of channels or driving waveforms, reaches around 100° C. as the layered piezoelectric element 12 becomes larger in length. When ink temperature rises due to the heating of the driver ICs 16, ink viscosity decreases so as to significantly affect the ejection characteristic. Therefore, the decrease in ink viscosity due to the rise in temperature of the driver ICs 16 should be avoided by any means. The heating of driver ICs is not so significant a problem in the conventional ink-jet head with a small number of channels. As the ink-jet head becomes greater in length, however, the decrease in ink viscosity due to the rise in temperature of driver ICs has become a serious problem. This problem can be solved by employing the above-described configuration.

Figure 2:
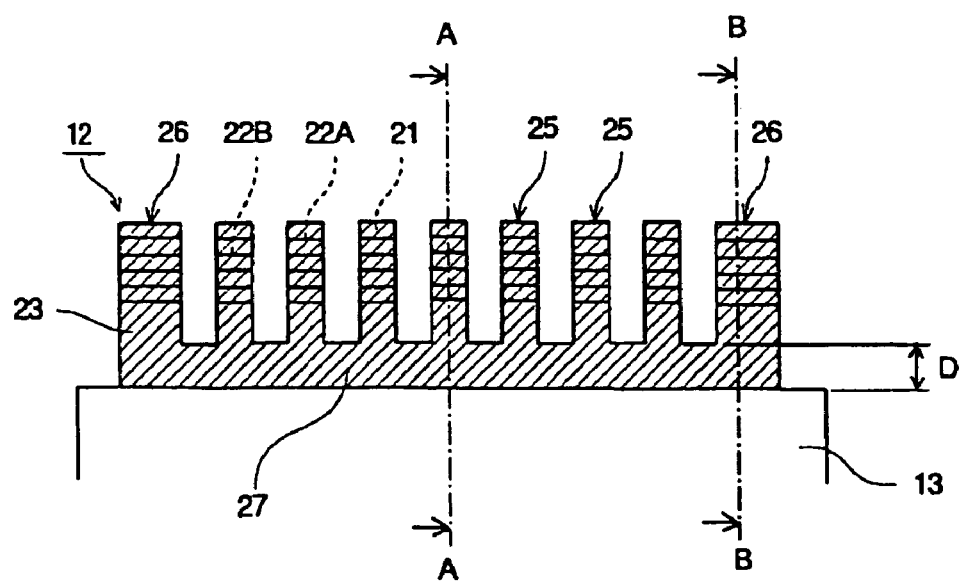
FIG. 2 is a sectional view of a layered piezoelectric element of the ink-jet head of FIG. 1 taken along directions perpendicular to the directions in which the pressure liquid chamber extends according to the first embodiment of the present invention.
Figure 3:
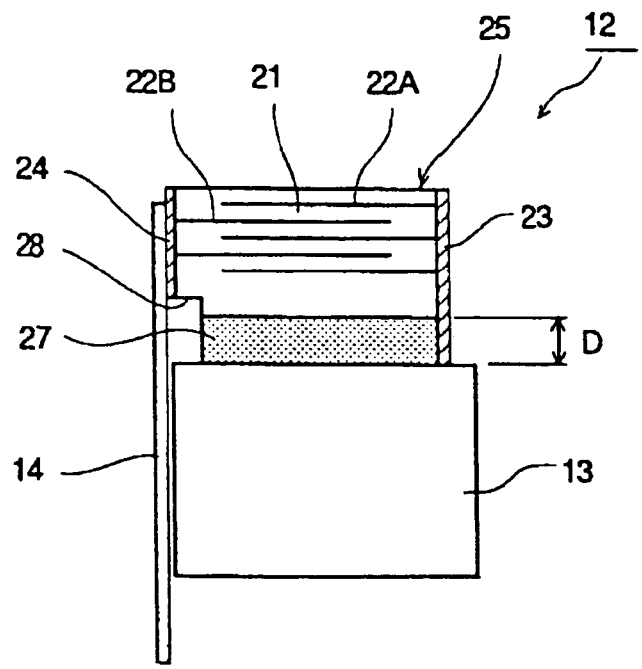
FIG. 3 is a sectional view of a driving part of the layered piezoelectric element of the ink-jet head of FIG. 2 taken along the line A—A.
Figure 4:
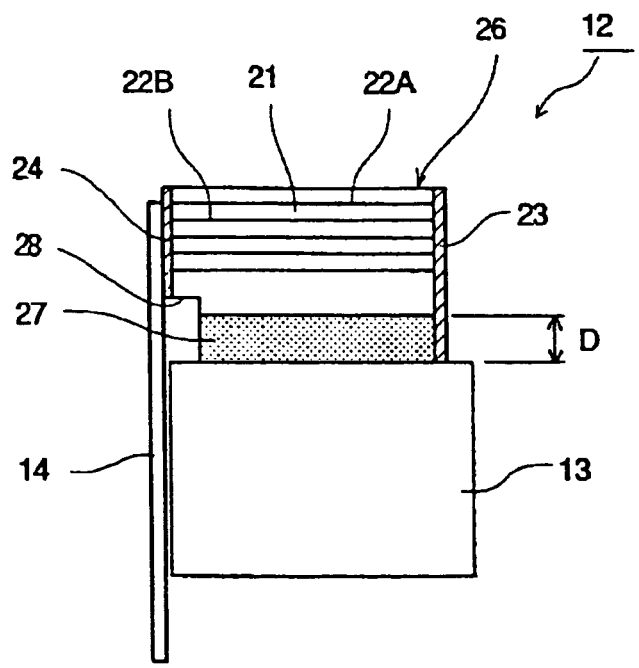
FIG. 4 is a sectional view of a non-driving part of the layered piezoelectric element of the ink-jet head of FIG. 2 taken along the line B—B.
Figure 5A:
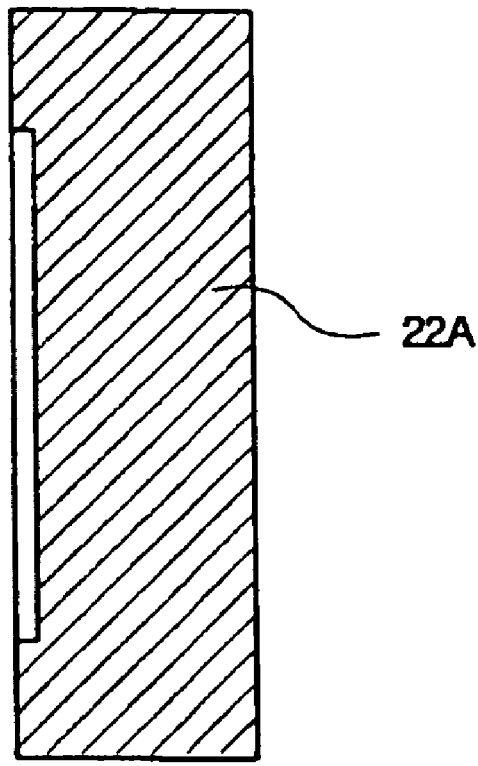
FIGS. 5A and 5B are plan views of internal electrode patterns of the layered piezoelectric element of the ink-jet head before processing according to the first embodiment of the present invention.
Figure 5B:
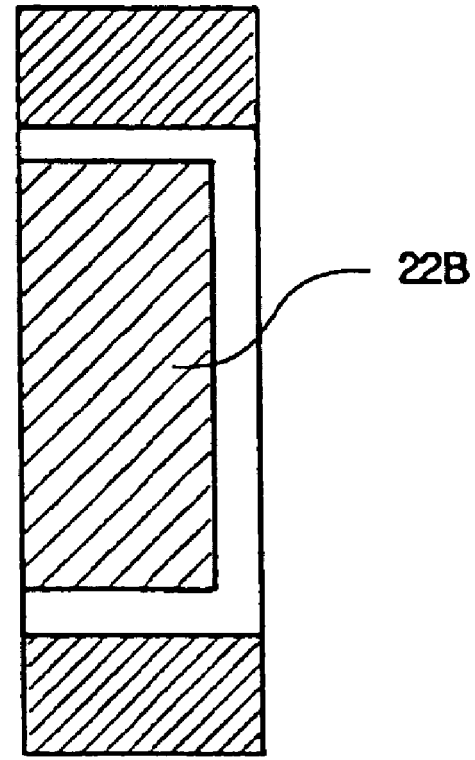
Figure 6:
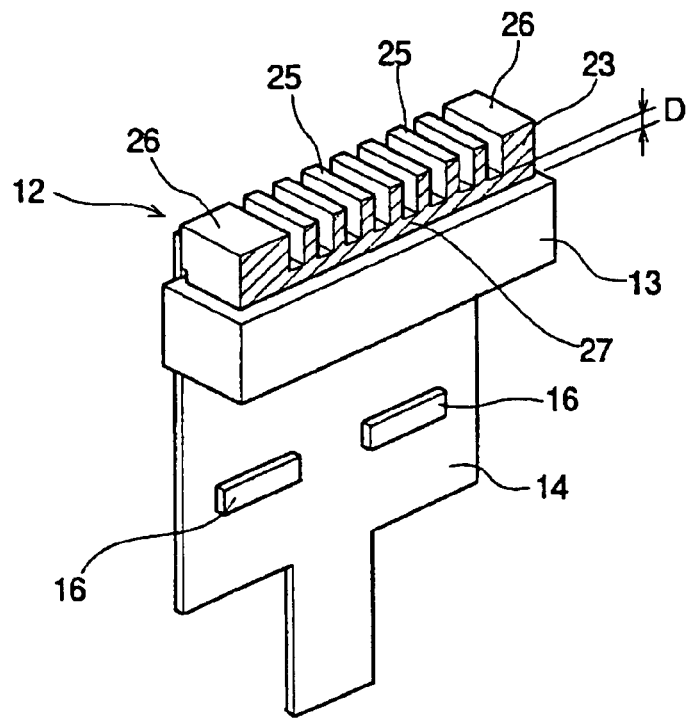
FIG. 6 is a perspective view of the layered piezoelectric element of the ink-jet head taken from the common electrode side according to the first embodiment of the present invention.
Figure 7:
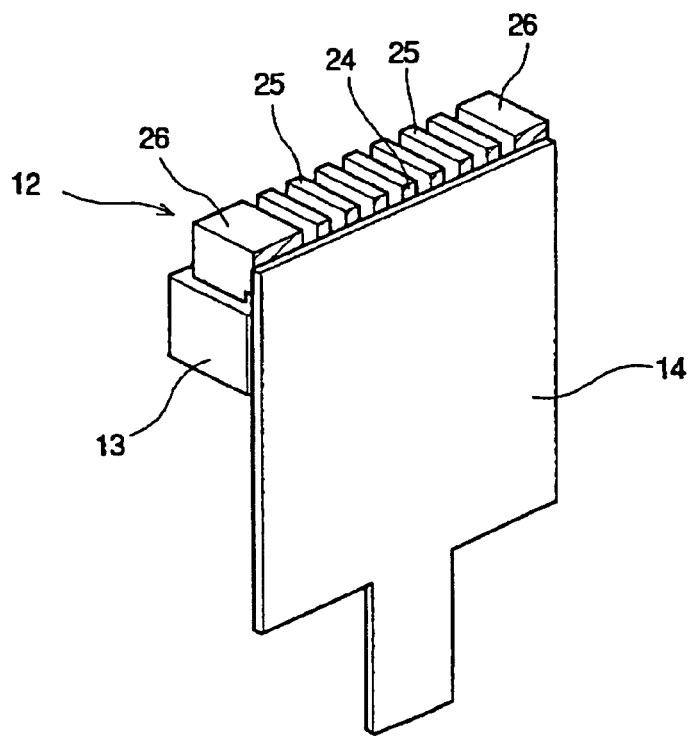
FIG. 7 is a perspective view of the layered piezoelectric element of the ink-jet head taken from the individual electrode side according to the first embodiment of the present invention.

A detailed description will be given herein, with reference to FIGS. 2 through 7, of the layered piezoelectric element 12. FIG. 2 is a sectional view of the layered piezoelectric element 12 of the ink-jet head of this embodiment taken along the directions perpendicular to the directions in which the pressure liquid chamber 6 extends. FIG. 3 is a sectional view of the layered piezoelectric element 12 of the ink-jet head of FIG. 2 taken along the line A—A. FIG. 4 is a sectional view of the layered piezoelectric element 12 of the ink-jet head of FIG. 2 taken along the line B—B. FIGS. 5A and 5B are plan views of internal electrode patterns of the layered piezoelectric element 12. FIG. 6 is a perspective view of the layered piezoelectric element 12 of the ink-jet head of this embodiment taken from the common electrode side. FIG. 7 is a perspective view of the layered piezoelectric element 12 of the ink-jet head of this embodiment taken from the individual electrode side.

In the layered piezoelectric element 12, a plurality of driving parts 25 (individual piezoelectric element parts) are formed between non-driving parts 26 on both ends of the array of the driving parts 25 by performing slitting or grooving processing on alternate layers of piezoelectric layers (piezoelectric material layers) 21 and internal electrodes 22A and 22B having pattern shapes as shown in FIGS. 5A and 5B, respectively, with a common external electrode 23 and the individual external electrodes 24 formed on the opposing longitudinal sides of the layer structure. The common external electrode 23 is formed of the external electrodes on the common electrode side of the respective driving parts 25.

In this slitting or grooving process, slits are formed in the layered piezoelectric element 12 so that a bridge part 27 of a size D in the depth direction remains in the bottom of the layered piezoelectric element 12 on the base 13. Further, a cutout 28 is formed on the individual external electrode (24) side of the layered piezoelectric element 12 along the directions in which the driving parts 25 are arranged.

Accordingly, the internal electrode 22A of each driving part 25 is connected to the common external electrode 23, which is prevented from being divided due to the bridge part 27, so that the internal electrode 22A of each driving part 25 is connected through the common external electrode 23 to the internal electrodes 22A of the non-driving parts 26 on both ends. Further, the internal electrodes 22A of the non-driving parts 26 extend to the individual external electrode (24) side of the layered piezoelectric element 12 as shown in FIG. 4. Therefore, by connecting the FPC cable 14 to the individual external electrode (24) side, the common electrode and the individual electrodes can be extended from the one side of the layered piezoelectric element 12.

In the ink-jet head having the above-described configuration, a driving pulse voltage of 20 to 50 V is applied to a selected one or more of the driving parts 25 of the layered piezoelectric element 12 so that the driving parts 25 to which the driving pulse voltage is applied stretch in the direction in which the layers are formed (that is, in the upward direction in FIGS. 2 through 4) so as to deform the diaphragm 2 toward the nozzles 5. Thereby, the capacity or the volume of each corresponding pressure liquid chamber 6 changes so as to pressurize ink therein, so that ink droplets are ejected (sprayed) from the corresponding nozzles 5.

With the ejection of ink droplets, liquid pressure inside the pressure liquid chambers 6 decreases, so that a certain negative pressure is generated in the pressure liquid chambers 6 by the inertia of ink flow at this moment. By suspending application of the voltage to the layered piezoelectric element 12 in this state, the diaphragm 2 returns to its original position so as to restore the pressure liquid chambers 6 to their original shape, thereby generating further negative pressure. At this point, ink flows through the ink supply channel 18, the common liquid chamber 8, and the ink supply channels (fluid resistance parts) 7 to be filled into the pressure liquid chambers 6. Then, after the vibrations of the ink meniscus surfaces of the nozzles 5 attenuate to stabilize, another pulse voltage is applied to the layered piezoelectric element 12 for the next ejection of ink droplets, so that ink droplets are ejected.

Figure 8:
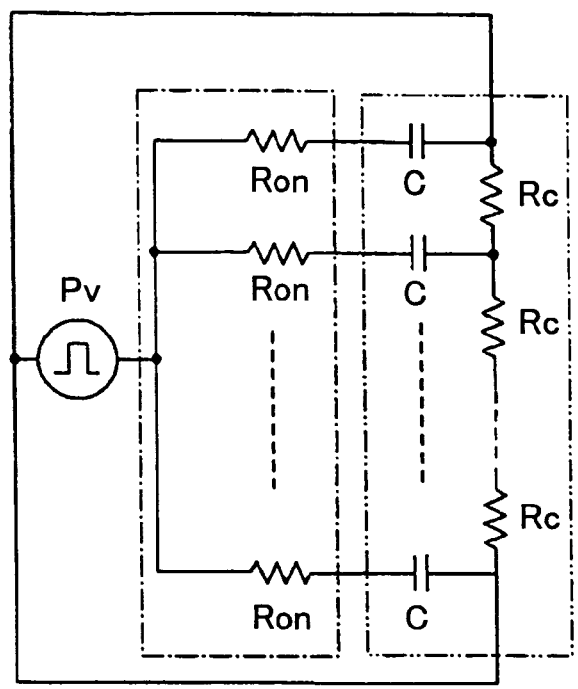
FIG. 8 is a diagram showing a circuit equivalent to an electrical circuit from a driving waveform generating part to the layered piezoelectric element of the ink-jet head according to the first embodiment of the present invention.

FIG. 8 is a diagram showing a circuit equivalent to an electrical circuit from a driving waveform generating part to the layered piezoelectric element 12. As shown in FIG. 8, each driving part (driving channel) 25 is formed of a series circuit of a resistor (resistance) $R_{on}$ (Ω) and a capacitor (capacitance) C (F), and the driving parts 25 are connected with each other by resistors (resistances) $R_c$ (Ω). The circuit of FIG. 8 is simplified so as to replace the resistors $R_c$ with common electrode resistors (resistances) $R_{com}$ (Ω) each interposed between the driving parts 25 and each non-driving part 26 as shown in FIG. 9.

Figure 9:
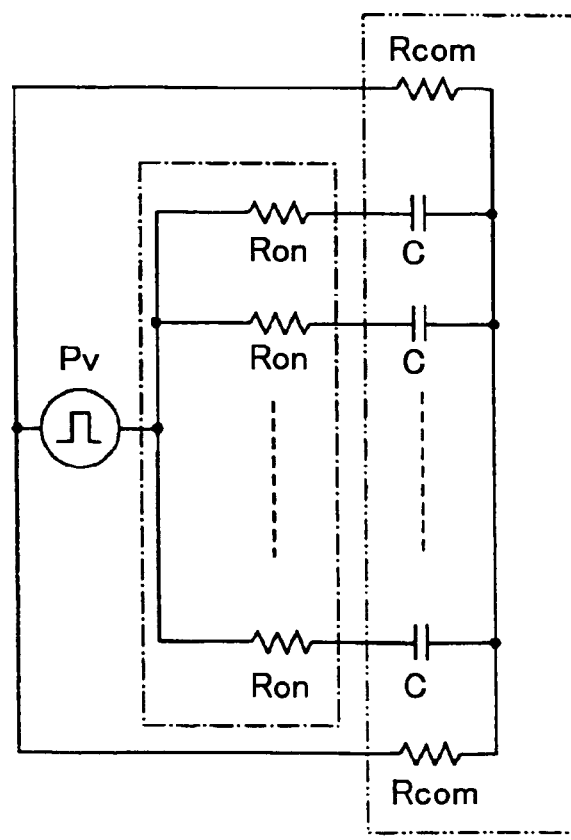
FIG. 9 is a diagram showing a simplified version of the equivalent circuit of FIG. 8 according to the first embodiment of the present invention.
Figure 10:
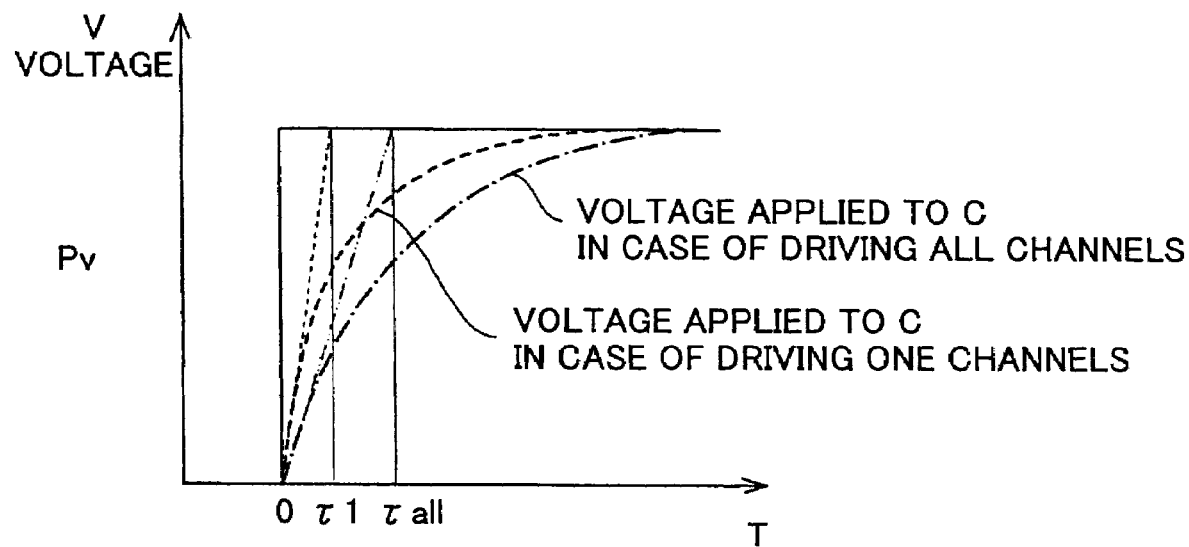
FIG. 10 is a graph for illustrating the difference between the time constant of a diving voltage in the case of driving all channels and that in the case of driving one channel according to the first embodiment of the present invention.

When a pulse driving voltage $P_v$ is applied, as shown in FIG. 10, to the circuit of FIG. 9, letting the number of driving parts (driving channels) 25 be n, the time constant $\tau_1$ (sec) of the driving voltage $P_v$ applied to the driving part 25 in the case of driving only one of the n channels is given by the following equation (1):

$$\tau_1 = C(R_{on} + R_{com}) \tag{1}$$

Further, the time constant $\tau_{all}$ (sec) of the driving pulse $P_v$ applied to the driving parts 25 in the case of driving all the n channels is given by the following equation (2):

$$\tau_{all} = C(R_{on} + n \cdot R_{com}/2) \tag{2}$$

Accordingly, the difference $\Delta\tau$ between the time constant $\tau_{all}$ in the case of driving all the n channels and the time constant $\tau_1$ in the case of driving only one of the n channels can be obtained from the following equation (3):

$$\begin{aligned}\Delta\tau &= \tau_{all} - \tau_1 \\ &= C(R_{on} + n \cdot R_{com}/2) - C(R_{on} + R_{com}) \\ &= C(n/2 - 1) \cdot R_{com}\end{aligned} \tag{3}$$

The equation (3) shows that as the number of driving channels n becomes larger or the common electrode resistance $R_{com}$ becomes larger, a change in the driving time constant τ becomes greater. That is, a change in the ink droplet ejection characteristic becomes greater.

On the other hand, the ink droplet ejection characteristic most affected by the change in the time constant τ is an ejection velocity $V_j$. When the ejection velocity $V_j$ changes, time required for an ink droplet to be ejected from the ink-jet head to be positioned on a paper sheet (a medium onto which ink droplets are ejected) also changes. Since the ink-jet head moves in the primary scanning direction, this change ultimately appears as a deviation of a dot position in the primary scanning direction.

In the case of recording a 600-dpi image, when the deviation of a line (Δdot) exceeds approximately one dot, or 42.3 μm in distance, the deviation is large enough to be visually recognized. Therefore, the deviation is preferably smaller than or equal to 42.3 μm in terms of higher image quality.

Letting the ejection velocity in the case of driving all the n channels, the ejection velocity in the case of driving only one of the n channels, and the nozzle-paper distance be $V_{jall}$, $V_{j1}$, and L, respectively, the difference ΔT between time required for an ink droplet to travel from nozzle to paper in the case of driving all the n channels and that in the case of driving only one of the n channels is given by the following equation (4):

$$\Delta T = L/V_{jall} - L/V_{j1} \tag{4}$$

Further, letting scanning velocity for the primary scanning direction be $V_s$, the deviation of a dot (Δdot) is given by the following equation (5):

$$\Delta\text{dot} = \Delta T \times V_s = (L/V_{jall} - L/V_{j1}) \times V_s \tag{5}$$

Therefore, the ejection velocity $V_{jall}$ in the case of driving all the n channels is required to satisfy the following equation (6):

$$V_{jall} = L/(\Delta\text{dot}/V_s + L/V_{j1}) \tag{6}$$

Figure 11:
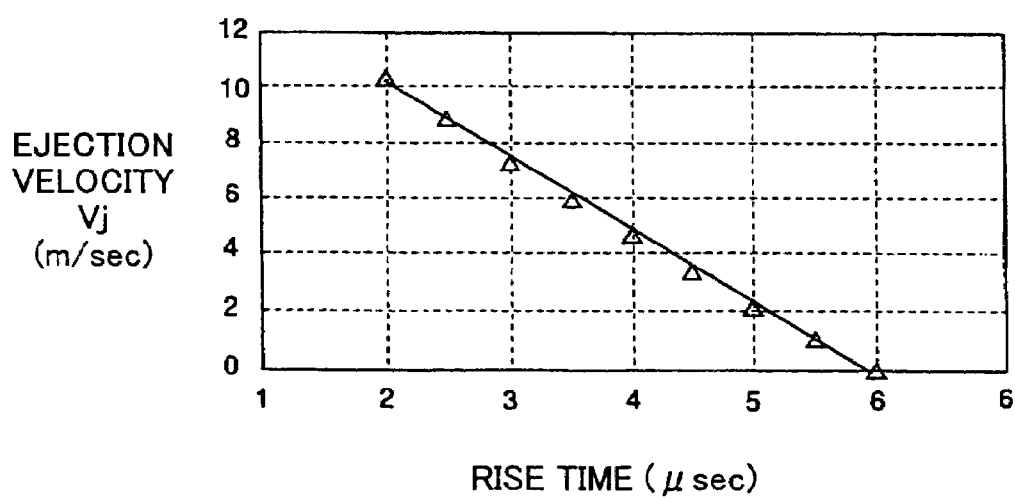
FIG. 11 is a graph for illustrating a relationship between the rise time of the driving voltage and droplet ejection speed according to the first embodiment of the present invention.

When the ejection velocity $V_j$ (m/sec) was measured with respect to the rise time (μsec) of the driving voltage $P_v$ with the primary scanning velocity $V_s$ and the nozzle-paper distance L being set to 0.4 m/s (600 dpi) and 0.001 m, respectively, the characteristic as shown in FIG. 11 was obtained.

Here, if the ejection velocity $V_{j1}$ in the case of driving only one of the n channels is set to 10 m/sec ($\tau_1$=approximately 2 μlsec), in order to set Δdot to a value smaller than or equal to 42.3 μm as previously described, the ejection velocity $V_{jall}$ in the case of driving all the n channels is required to be set to a value larger than or equal to 4.86 m/sec, according to the above-described measurement results. Therefore, the time constant $\tau_{all}$ in the case of driving all the n channels is set to approximately 4 μsec.

Therefore, it is preferable to set the difference Δτ between the time constant $\tau_{all}$ and the time constant $\tau_1$ to a value smaller than or equal to $\tau_{all}-\tau_1=4-2=2$ μsec. Thereby, the degradation of image quality due to the deviation of a dot position can be prevented, particularly in the case of recording an approximately 600-dpi image.

Thus, in the layered piezoelectric element 12 of the ink-jet head of this embodiment, letting the capacitance of each driving part 25, the number of driving parts 25, and the resistance between the common electrode extension parts (non-driving parts 26) on both ends be C (F), n, and R (Ω), respectively, C (F), n, and R (Ω) satisfy the following condition (7):

$$R \leq 8 \times 10^{-6}/n/C \quad (7)$$

That is, based on the above-described equation (3), the following expression (8) should hold in order to satisfy Δτ ≦2 μsec in the ejection characteristic.

$$C(n/2-1) \cdot R_{com} \leq 2 \times 10^{-6} \quad (8)$$

If the actuator is long so that n is sufficiently large, (n/2−1) can be regarded as n/2. Therefore, the above-described expression (8) can be converted to the following expression (9):

$$R_{com} \leq 4 \times 10^{-6}/n/C \quad (9)$$

Since the resistance R between the common electrode extension parts of the layered piezoelectric element 12 is twice the resistance $R_{com}$, the expression (9) can be expressed as the expression (7).

Thereby, the difference between the time constant of the driving voltage $P_v$ applied in the case of driving one of the channels and the time constant of the driving voltage $P_v$ applied in the case of driving all the channels can be set to a value smaller than or equal to 2 μsec in the ink-jet head of this embodiment. Thereby, variation in the ejection characteristic of the ink-jet head is reduced so that a stable high-quality image can be obtained.

Second Embodiment

Figure 12:
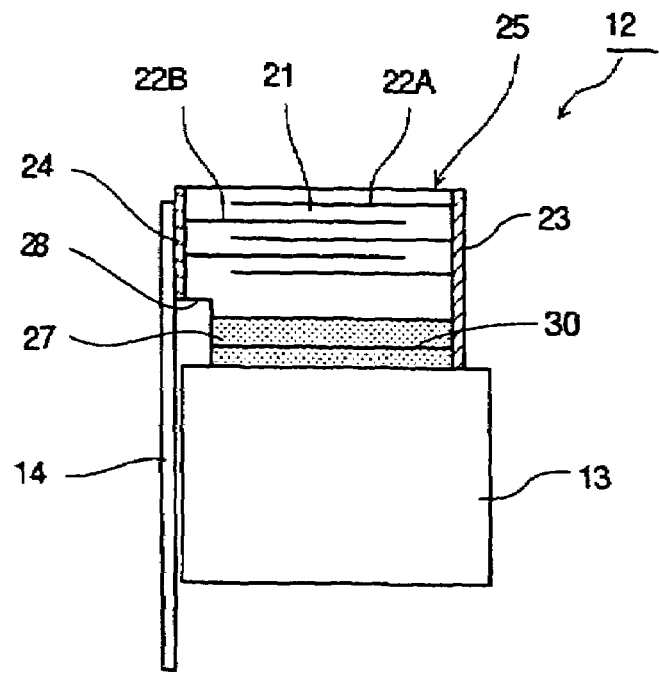
FIG. 12 is a sectional view of the layered piezoelectric element of an ink-jet head taken along directions in which a pressure liquid chamber thereof extends according to a second embodiment of the present invention.
Figure 13:
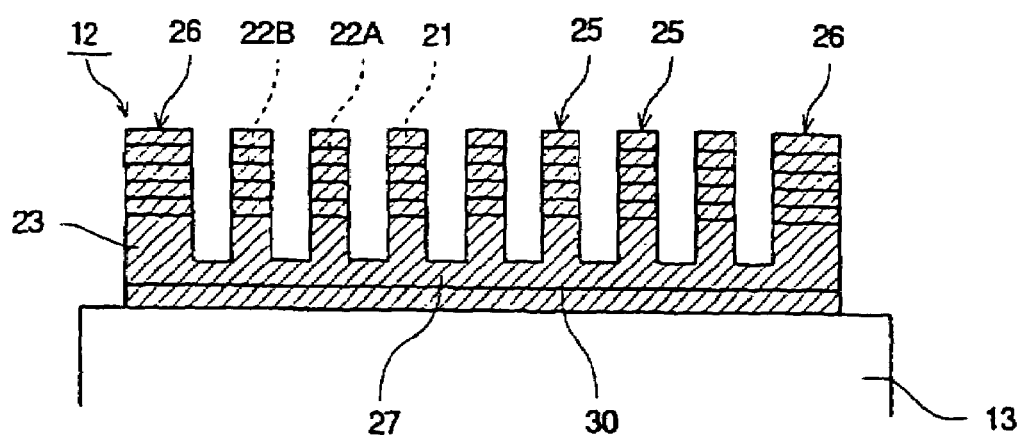
FIG. 13 is a sectional view of the layered piezoelectric element of the ink-jet head of FIG. 12 taken along directions perpendicular to the directions in which the pressure liquid chamber extends according to the second embodiment of the present invention.
Figure 14:
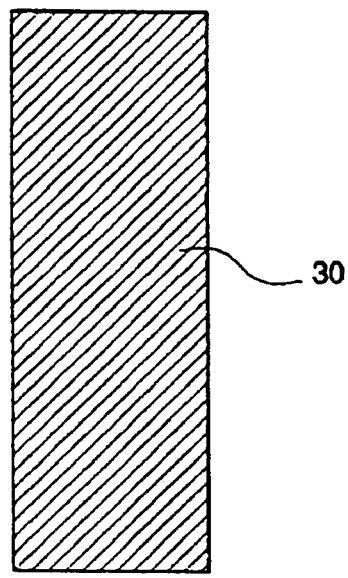
FIG. 14 is a plan view of an internal electrode pattern for conduction of the layered piezoelectric element according to the second embodiment of the present invention.

Next, a description will be given, with reference to FIGS. 12 through 14, of an ink-jet head as a liquid droplet ejecting head according to a second embodiment of the present invention. In the second embodiment, the same elements as those described in the first embodiment are referred to by the same numerals. FIG. 12 is a sectional view of the layered piezoelectric element 12 of the ink-jet head taken along the directions in which the pressure liquid chamber thereof extends. FIG. 13 is a sectional view of the layered piezoelectric element 12 of the ink-jet head of this embodiment taken along the directions perpendicular to the directions in which the pressure liquid chamber extends (or the directions in which the driving parts 25 are arranged). FIG. 14 is a plan view of an internal electrode pattern of the layered piezoelectric element 12 according to this embodiment.

The layered piezoelectric element 12 of the second embodiment has an internal electrode 30 for conduction provided in the bridge part 27, which is not divided by the grooving processing. The internal electrode 30 has a pattern whose shape is equal to the planar outline of the layered piezoelectric element 12 as shown in FIG. 14. In forming the layered piezoelectric element 12, the internal electrode 30 can be formed easily in the bridge part 27 by forming the internal electrode 30 between the piezoelectric layers 21 by printing when the internal electrodes 22A and 22B are layered, printed on the green sheets serving as the piezoelectric layers 21.

The internal electrode 30 remains connected to the common external electrode 23 under the driving parts 25 after the grooving processing. Thereby, the channel of electricity widens greatly on the common electrode side so that the common electrode resistance can be reduced. The internal electrode 30 may have any shape as long as the internal electrode 30 is connectable to the common external electrode 23 of the driving parts 25 after the grooving processing. The wider the internal electrode 30, the greater the desired effect of reduction in the common electrode resistance.

The internal electrode 30 for conduction that is not divided by the grooving processing is thus provided so as to be connected to the common external electrode 23. Thereby, the common electrode resistance is reduced, so that, as previously described, the difference between the time constant of the driving voltage $P_v$ applied to the layered piezoelectric element 12 in the case of driving one of the channels and that in the case of driving all the channels can be set to a value smaller than or equal to 2 μsec. Thereby, the difference in the ejection characteristic is reduced, so that a stable high-quality image can be obtained.

Third Embodiment

Figure 15:
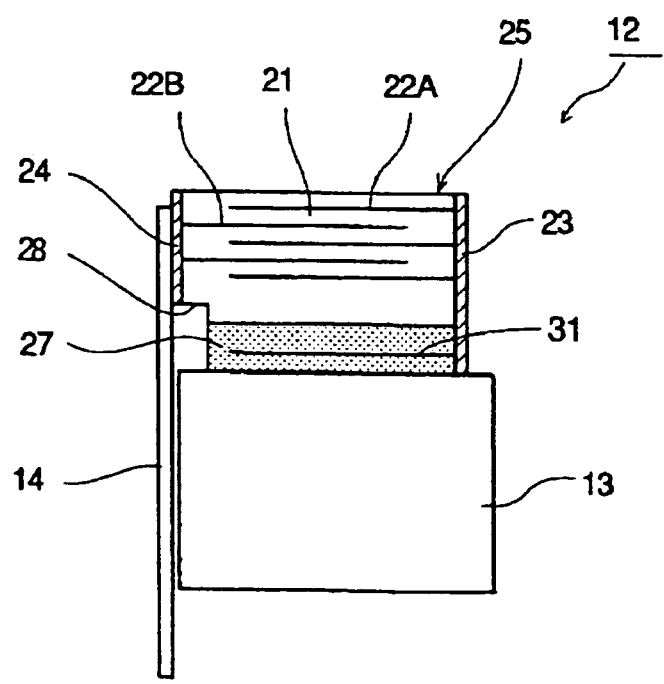
FIG. 15 is a sectional view of the layered piezoelectric element of an ink-jet head taken along directions in which a pressure liquid chamber thereof extends according to a third embodiment of the present invention.
Figure 16:
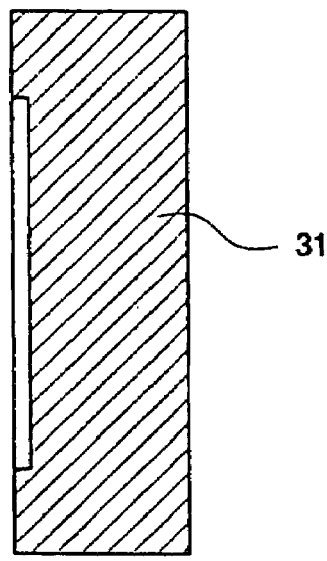
FIG. 16 is a plan view of an internal electrode pattern for conduction of the layered piezoelectric element according to the third embodiment of the present invention.

Next, a description will be given, with reference to FIGS. 15 and 16, of an ink-jet head as a liquid droplet ejecting head according to a third embodiment of the present invention. In the third embodiment, the same elements as those described in the first and second embodiments are referred to by the same numerals. FIG. 15 is a sectional view of the layered piezoelectric element 12 of the ink-jet head taken along the directions in which the pressure liquid chamber thereof extends. FIG. 16 is a plan view of an internal electrode pattern of the layered piezoelectric element 12 according to this embodiment.

The layered piezoelectric element 12 of the third embodiment has an internal electrode 31 for conduction provided in the bridge part 27, which is not divided by the grooving processing, so as to be connected to the common external electrode 23. As shown in FIG. 16, the internal electrode 31 has a pattern whose shape is equal to that of the internal electrode 22A.

Thereby, there is no need to prepare a special print pattern for the internal electrode 31 for conduction, so that the manufacturing facilities are simplified.

Fourth Embodiment

Figure 17:
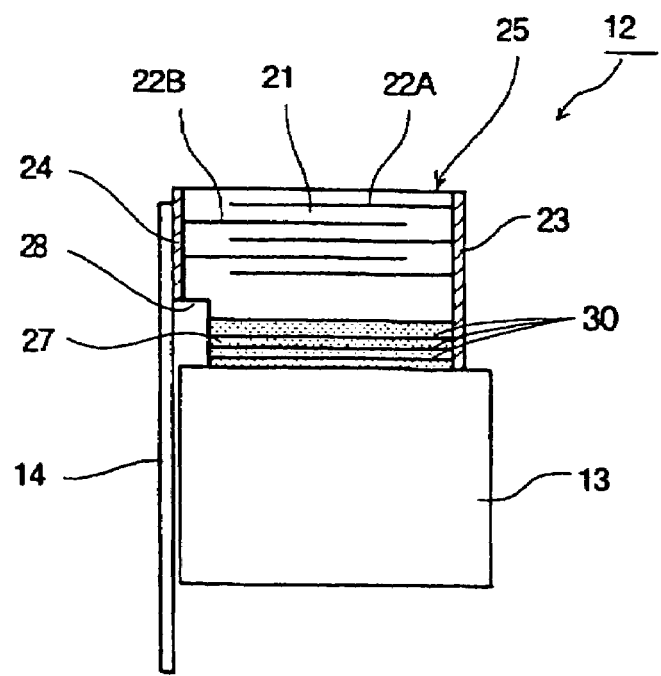
FIG. 17 is a sectional view of the layered piezoelectric element of an ink-jet head taken along directions in which a pressure liquid chamber thereof extends according to a fourth embodiment of the present invention.

Next, a description will be given, with reference to FIG. 17, of an ink-jet head as a liquid droplet ejecting head according to a fourth embodiment of the present invention. In the fourth embodiment, the same elements as those described in the first through third embodiments are referred to by the same numerals. FIG. 17 is a sectional view of the layered piezoelectric element 12 of the ink-jet head taken along the directions in which the pressure liquid chamber thereof extends.

The layered piezoelectric element 12 of the fourth embodiment has the internal electrodes 30 for conduction of the second embodiment provided in a plurality of layers in the bridge part 27, which is not divided by the grooving processing, so as to be connected to the common external electrode 23. The internal electrodes 30 may be replaced by the internal electrodes 31 of the third embodiment or internal electrodes having another pattern shape.

By thus providing the internal electrodes 30 in a plurality of layers, the common electrode resistance can be further reduced. Normally, the thickness of the internal electrode is subject to limitation due to a manufacturing method. Therefore, it is not easy to increase the internal electrode in thickness so as to reduce resistance. Further, the internal electrode, which, generally, is formed of a palladium-silver alloy, has a high volume resistivity compared with gold or copper used for the external electrode. Accordingly, a single internal electrode layer for conduction can reduce the common external electrode resistance only to a limited extent. Even when a plurality of internal electrode layers are provided as in this embodiment, the thickness between the internal electrode layers can be as small as approximately 20 μm. Therefore, an adverse effect such as increase in the thickness of a piezoelectric body can be reduced.

Fifth Embodiment

Figure 18:
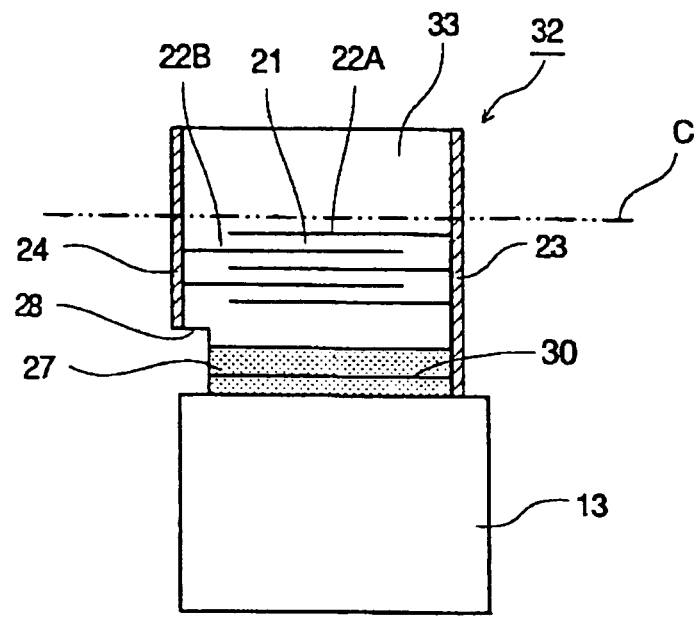
FIG. 18 is a sectional view of an unprocessed layered piezoelectric element to be processed into the layered piezoelectric element of an ink-jet head for illustrating a method of manufacturing the layered piezoelectric element according to a fifth embodiment of the present invention.

Next, a description will be given, with reference to FIG. 18, of a method of manufacturing the layered piezoelectric element 12 according to a fifth embodiment of the present invention. FIG. 18 is a sectional view of an unprocessed layered piezoelectric element 32, which is a member to be processed into the layered piezoelectric element 12.

According to the manufacturing method of the fifth embodiment, first, the unprocessed layered piezoelectric element 32 including a dummy part 33 is formed. The dummy part 33 is formed of a piezoelectric layer to be substantially symmetric in shape to the group of the internal electrodes 22A and 22B (or the structure of the internal electrodes 22A and 22B with the corresponding piezoelectric layers 21) in the direction in which the layers are formed. Then, after fixing the unprocessed layered piezoelectric element 32 to the base 13, the dummy part 33 is ground to the finishing line C shown in FIG. 18, so that the layered piezoelectric element 12 of FIG. 12 is formed. The unprocessed layered piezoelectric element 32 can also be formed into the layered piezoelectric element of FIG. 15 or FIG. 17.

Thereby, the warp of a layered piezoelectric element generated at the time of baking or polarizing the layered piezoelectric element can be reduced, thus preventing problems caused by the warp of the layered piezoelectric element at the time of manufacturing an ink-jet head, such as inability to hold a piezoelectric body by air suction and peeling of an adhesive agent caused by stress in the warp direction at the time of bonding the layered piezoelectric element to a base.

Sixth Embodiment

Figure 19:
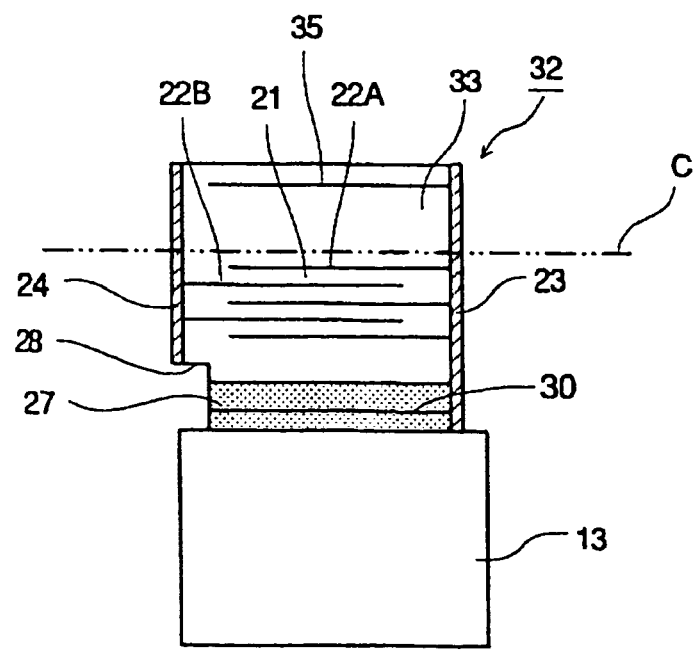
FIG. 19 is a sectional view of the unprocessed layered piezoelectric element for illustrating a method of manufacturing the layered piezoelectric element according to a sixth embodiment of the present invention.

Next, a description will be given, with reference to FIG. 19, of a method of manufacturing the layered piezoelectric element 12 according to a sixth embodiment of the present invention. FIG. 19 is a sectional view of the unprocessed layered piezoelectric element 32 according to the manufacturing method of the sixth embodiment.

According to the manufacturing method of the sixth embodiment, a dummy internal electrode 35 having substantially the same pattern shape as the internal electrode 30 is formed in the dummy part 33 of the unprocessed layered piezoelectric element 32 so that the dummy internal electrode 35 and the internal electrode 30 are substantially in symmetrical positions. In the case of forming the layered piezoelectric element 12 of FIG. 15, it is preferred that the dummy internal electrode 35 be formed to have substantially the same pattern shape as the internal electrode 31 so that the dummy internal electrode 35 and the internal electrode 31 are substantially in symmetrical positions. In the case of forming the internal electrodes 30 in a plurality of layers, it is preferable to form the dummy internal electrodes 35 in a plurality of layers.

Thereby, the symmetry of the unprocessed layered piezoelectric element 32 is improved further than by the manufacturing method of the fifth embodiment. Therefore, the warp of a layered piezoelectric element generated at the time of baking or polarizing the layered piezoelectric element can be further reduced, thus further preventing problems caused by the warp of the layered piezoelectric element at the time of manufacturing an ink-jet head, such as inability to hold a piezoelectric body by air suction and peeling of an adhesive agent caused by stress in the warp direction at the time of bonding the layered piezoelectric element to a base.

Seventh Embodiment

Figure 20:
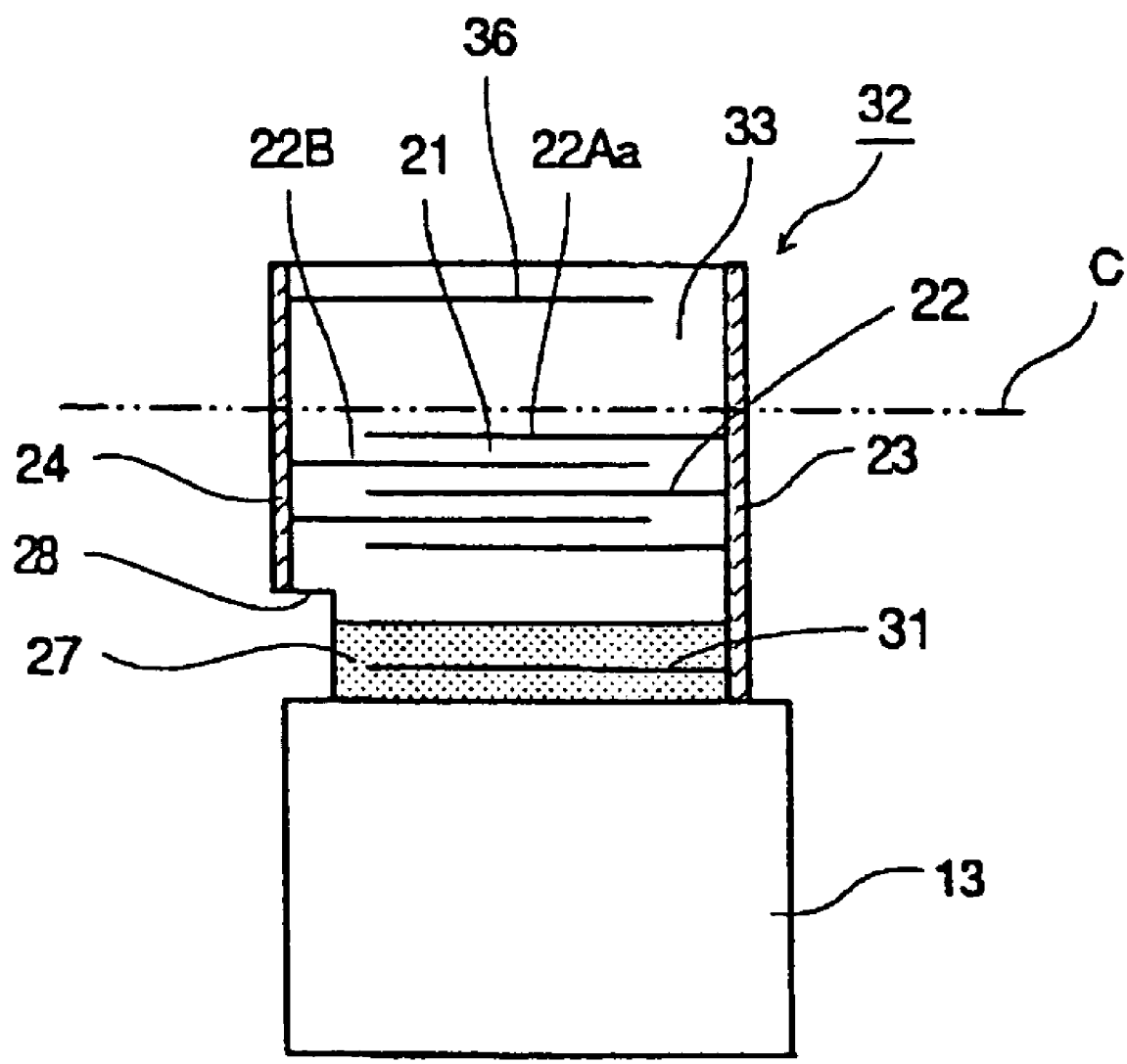
FIG. 20 is a sectional view of the unprocessed layered piezoelectric element for illustrating a method of manufacturing the layered piezoelectric element according to a seventh embodiment of the present invention.

Next, a description will be given, with reference to FIG. 20, of a method of manufacturing the layered piezoelectric element 12 according to a seventh embodiment of the present invention. FIG. 20 is a sectional view of the unprocessed layered piezoelectric element 32 according to the manufacturing method of the seventh embodiment.

According to the manufacturing method of the seventh embodiment, a dummy internal electrode 36 is formed in the dummy part 33 of the unprocessed layered piezoelectric element 32 so as to have the same pattern shape as an internal electrode that alternates with an internal electrode 22A that is closest to the surface of the layered piezoelectric element 12 into which the unprocessed layered piezoelectric element 32 is processed. That is, in this case, the dummy internal electrode 36 is formed to have the pattern shape as the internal electrode 22B. As previously described, the internal electrode 31 has the same pattern shape as the internal electrode 22A.

By thus forming the dummy internal electrode 36, the layering order pattern of internal electrodes can be simplified. Thereby, the number of wasted internal electrodes can be reduced at the time of manufacturing the layered piezoelectric element 12.

Figure 21A:
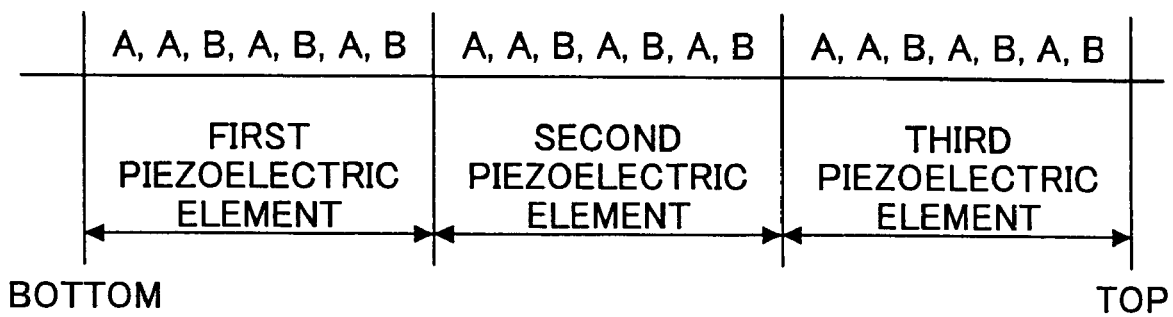
FIGS. 21A and 21B are diagrams for illustrating an effect produced by the manufacturing method according to the seventh embodiment of the present invention.
Figure 21B:
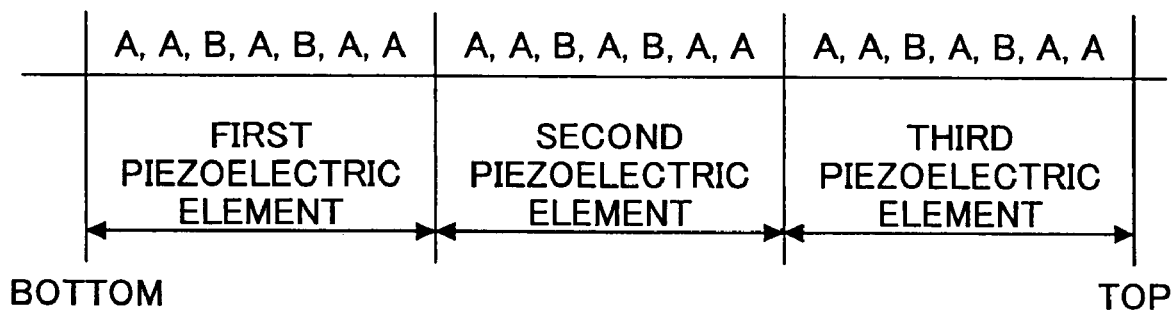

That is, in the case of forming the dummy internal electrode 36 and the internal electrode 22B into the same shape and forming the internal electrode 31 and the internal electrode 22A into the same shape, the internal electrodes are layered from top to bottom in the order as shown in FIG. 21A. In FIGS. 21A and 21B, "A" refers to an internal electrode having the same pattern shape as the internal electrode 22A, and "B" refers to an internal electrode having the same pattern shape as the internal electrode 22B. Generally, when internal electrodes are categorized in two types by pattern shape, the two types of internal electrodes alternate with each other in being printed due to their printing method. In this case, each piezoelectric element includes one part of successive "A"s where the internal electrodes "A" are successively layered. Therefore, the internal electrode "B" formed between the successive internal electrodes "A" is wasted.

On the other hand, in the case of forming the dummy internal electrode 36 as well as the internal electrode 31 into the same shape as the internal electrode 22A, the internal electrodes are layered from top to bottom in the order as shown in FIG. 21B. In this case, two parts of successive "A"s are formed in each piezoelectric element and one part of successive "A"s is formed between each adjacent piezoelectric elements, so that each piezoelectric element includes three successive-"A" parts in total. Therefore, three layers of internal electrodes "B" are wasted per piezoelectric element.

Eighth Embodiment

Figure 22:
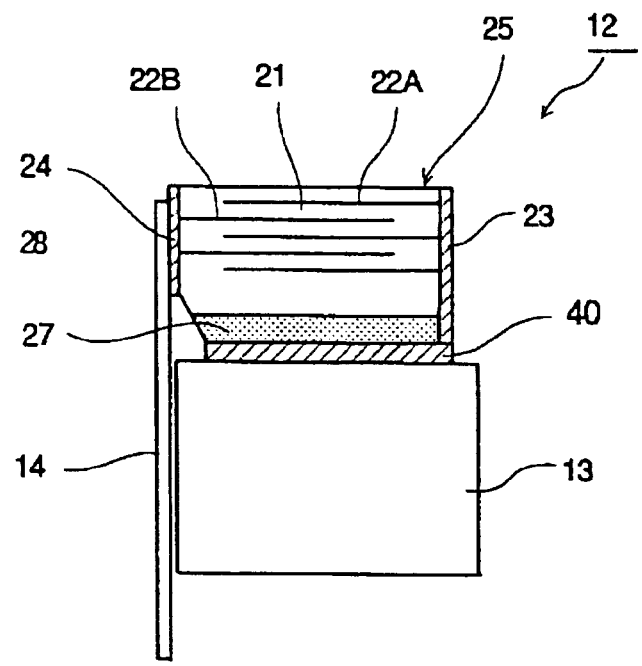
FIG. 22 is a sectional view of the layered piezoelectric element of an ink-jet head taken along directions in which a pressure liquid chamber thereof extends according to an eighth embodiment of the present invention.

Next, a description will be given, with reference to FIG. 22, of an ink-jet head as a liquid droplet ejecting head according to an eighth embodiment of the present invention. FIG. 22 is a sectional view of the layered piezoelectric element 12 of the ink-jet head taken along the directions in which the pressure liquid chamber thereof extends according to the eighth embodiment. The layered piezoelectric element 12 according to this embodiment includes an external electrode 40 for conduction having the same planar shape as the piezoelectric element 12. The external electrode 40 is formed on a surface of the layered piezoelectric element 12 which surface is not divided by the grooving processing so as to be connected to the common external electrode 23.

The external electrode 40 is not divided by the grooving processing. Therefore, the channel of electricity widens greatly on the common electrode side so that the common electrode resistance can be reduced. The external electrode 40 may have any shape as long as the external electrode 40 is connectable to the common external electrode 23 of the driving parts 25 after the grooving processing. The wider the external electrode 40, the greater the desired effect of reduction in the common electrode resistance.

By thus providing the external electrode 40 that is not divided by the grooving processing so that the external electrode 40 is connected to the common external electrode 23, the common electrode resistance is reduced, so that the difference between the time constant of the driving voltage $P_v$ applied to the layered piezoelectric element 12 in the case of driving one of the channels and that in the case of driving all the channels can be set to a value smaller than or equal to 2 μm. Thereby, the difference in the ejection characteristic can be reduced, so that a stable high-quality image can be obtained.

Ninth Embodiment

Figure 23:
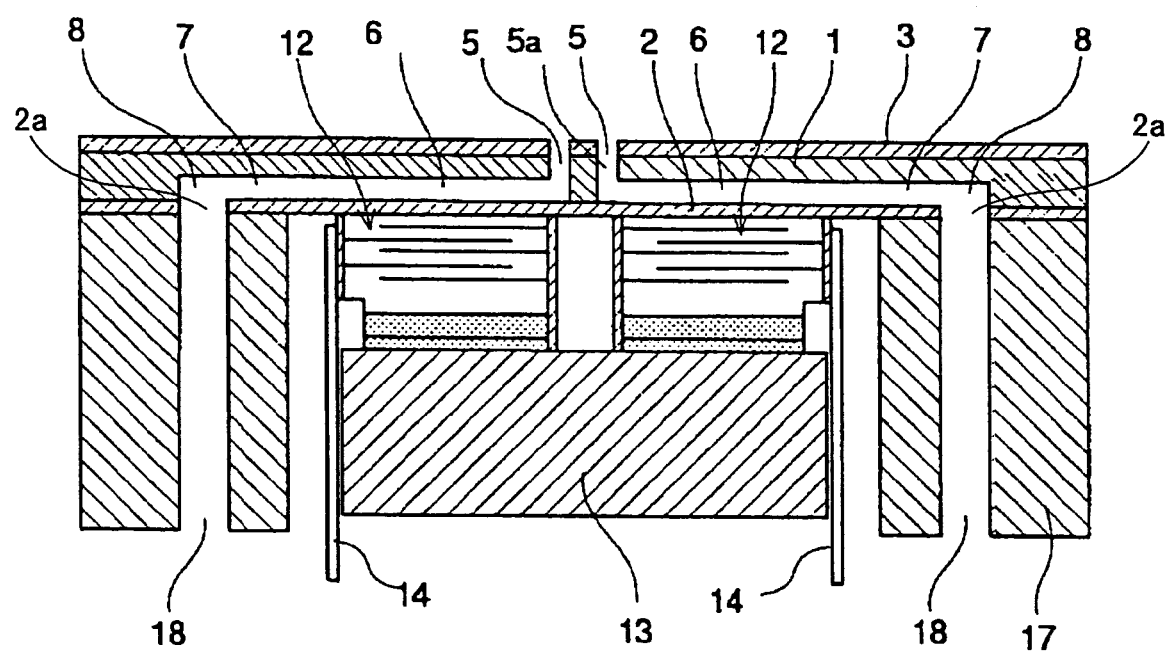
FIG. 23 is a sectional view of an ink-jet head taken along directions in which a pressure liquid chamber thereof extends according to a ninth embodiment of the present invention.

Next, a description will be given, with reference to FIG. 23, of an ink-jet head as a liquid droplet ejecting head according to a ninth embodiment of the present invention. FIG. 23 is a sectional view of the ink-jet head taken along the directions in which the pressure liquid chamber 6 thereof extends according to this embodiment.

The ink-jet head of this embodiment has the nozzles 5, the pressure liquid chambers 6 and the other liquid chambers, and the layered piezoelectric elements 12 arranged in two lines, respectively. In this embodiment, the layered piezoelectric elements 12 of the second embodiment are employed, but the layered piezoelectric elements 12 according to any of the other embodiments may be employed.

Figure 24:
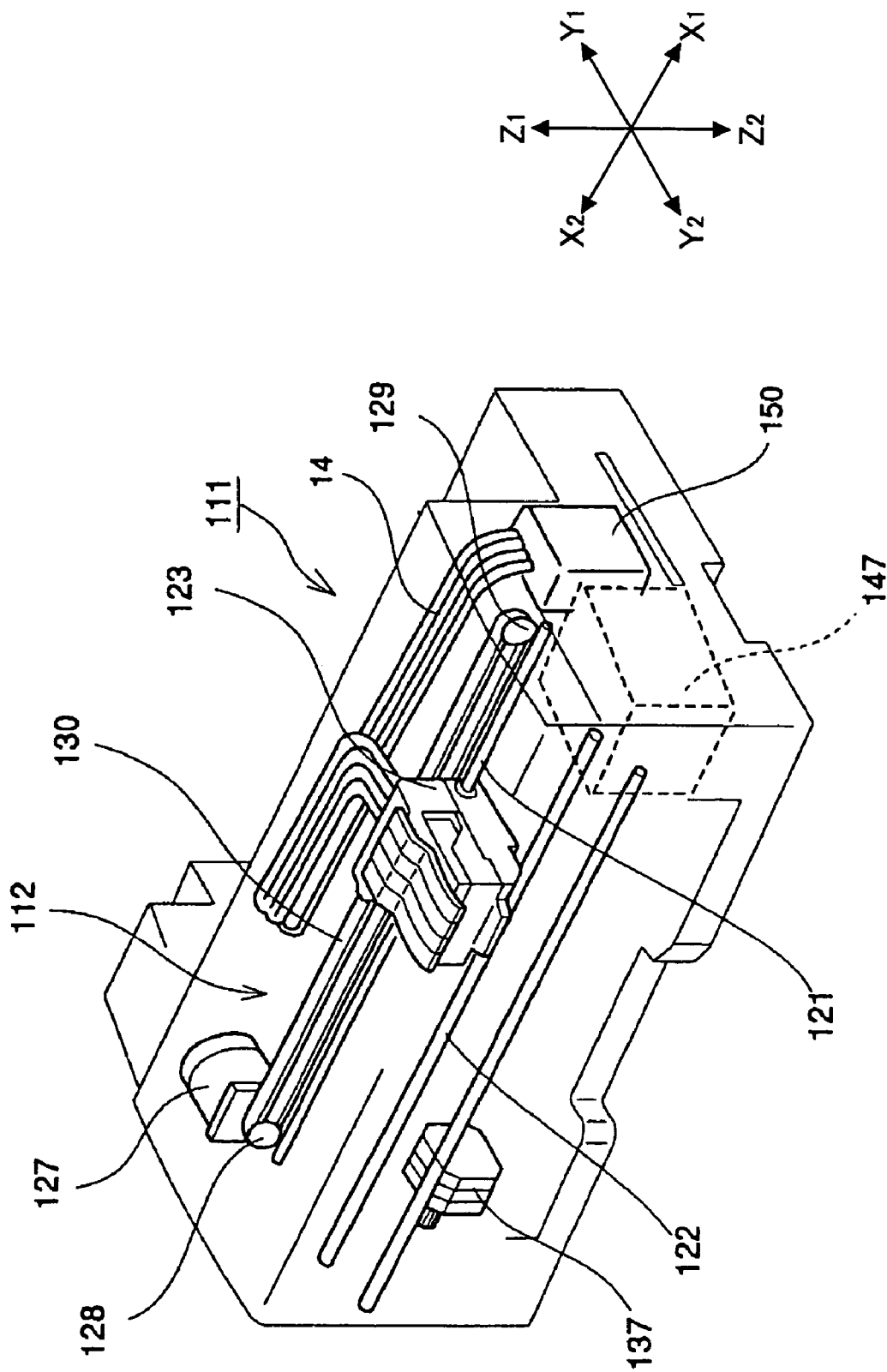
FIG. 24 is a perspective view of an ink-jet recording apparatus according to the ninth embodiment of the present invention.
Figure 25:
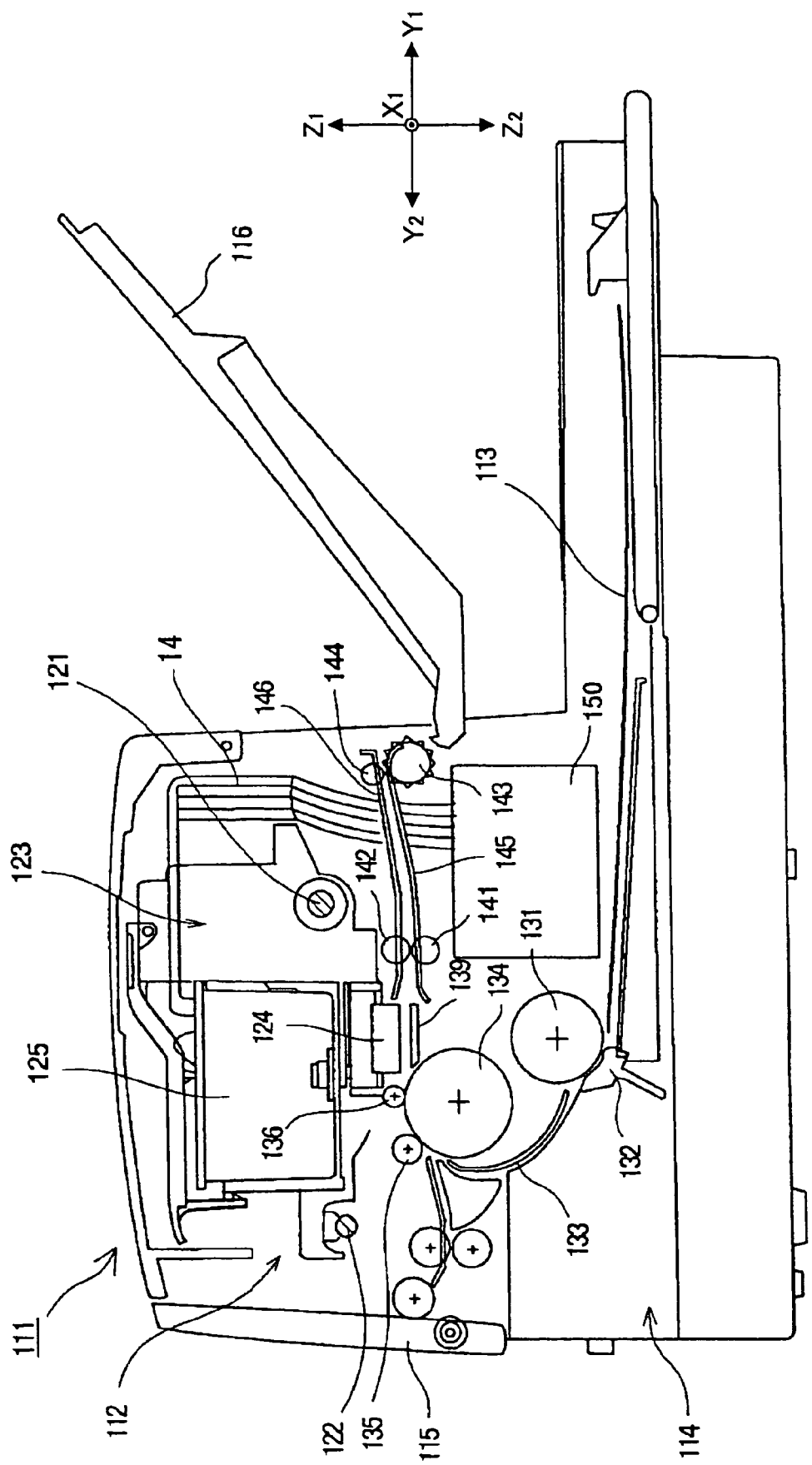
FIG. 25 is a side view of the ink-jet recording apparatus of FIG. 24 showing a mechanism part thereof according to the ninth embodiment of the present invention.

Next, a description will be given, with reference to FIGS. 24 and 25, of an ink-jet recording apparatus including the ink-jet head according to the ninth embodiment of the present invention. FIG. 24 is a perspective view of the ink-jet recording apparatus, and FIG. 25 is a side view of the ink-jet recording apparatus, showing a mechanism part thereof.

The ink-jet recording apparatus includes a print mechanism part 112 in a recording apparatus main body 111. The print mechanism part 112 is formed of a carriage 123 movable in the primary scanning direction, a recording head formed of the ink-jet heads of the present invention and mounted in the carriage 123, and ink cartridges 125 supplying ink to the recording head. A paper feed cassette (or a paper feed tray) 114 capable of containing multiple sheets of paper 113 can be detachably attached to the lower part of the main body 111 from the front side or the $Y_2$ side in FIGS. 24 and 25. A manual feed tray 115 for manually feeding the paper sheets 113 can be turned and opened. The paper sheet 113 fed from the paper feed cassette 114 or the manual feed tray 115 is loaded so that a required image is recorded thereon by the print mechanism part 112. Thereafter, the paper sheet 113 is ejected onto a paper ejection tray 116 attached to the backside or the $Y_1$ side of the main body 111.

In the print mechanism part 112, the carriage 123 is held slidably in the primary scanning direction by a primary guide rod 121 and a secondary guide rod 122 that are guide members extending between opposing side plates (not shown in the drawings). The primary scanning direction corresponds to the directions in which the primary and secondary guide rods 121 and 122 extend. That is, the primary scanning direction corresponds to the X-axis in FIGS. 24 and 25. Heads 124 formed of the ink-jet heads (liquid droplet ejecting heads) of the present invention ejecting yellow (Y) ink, cyan (C) ink, magenta (M) ink, and black (Bk) ink, respectively, are attached to the carriage 123 so that a plurality of ink ejection openings thereof are arranged in the directions to cross the primary scanning direction and ink is ejected from the ink ejection openings in the downward direction. The FPC cable 14 is connected between the heads 124 and a controller part 150 so as to apply a driving waveform to each of the heads 124. The FPC cable 14 exchanges signals between the heads 124 and the controller part 150.

The ink cartridges 125 for supplying the respective color inks to the corresponding heads 124 are attached replaceably to the carriage 123. Each ink cartridge 125 has a vent formed in its upper part and a supply opening formed in its lower part. The vent communicates with the atmosphere. Ink is supplied from each ink cartridge 125 through its supply opening to the corresponding head 124. Further, each ink cartridge 125 includes a porous body filled with ink so that the ink supplied to the corresponding head 124 is maintained at a slightly negative pressure by the capillary force of the porous body.

The heads 124 for the respective color inks employed as a recording head in this embodiment may be replaced by a single head including nozzles for ejecting ink droplets of the respective color inks.

The primary guide rod 121 penetrates through the rear ($Y_1$-side) part (part on the downstream side in the direction in which the paper sheet 113 is conveyed) of the carriage 123 so that the cartridge 123 can slide along the primary guide rod 121. The front ($Y_2$-side) part (part on the upstream side in the direction in which the paper sheet 113 is conveyed) of the carriage 123 is placed on the secondary guide rod 122 so that the carriage 123 can slide along the secondary guide rod 122. A timing belt 130 is extended between a drive pulley 128 rotated by a primary scanning motor 127 and a driven pulley 129. The timing belt 130 is fixed to the carriage 123 so that the carriage 123 is moved back and forth for scanning along the primary scanning direction by the reverse and forward rotations of the primary scanning motor 127.

On the other hand, in order to convey each paper sheet 113 set in the paper feed cassette 114 to a position below the heads 124, the ink-jet recording apparatus includes a paper feed roller 131 and a friction pad 132 for separating each paper sheet 113 from the paper feed cassette 114, a guide member 133 for guiding each paper sheet 113, a conveyance roller 134 conveying each fed paper sheet 113 upside down, a roller 135 pressed against the outside surface of the conveyance roller 134, and a tip roller 136 defining an angle at which each paper sheet 113 is sent from the conveyance roller 134. The conveyance roller 134 is rotated by a secondary scanning motor 137 via a gear train.

Further, the ink-jet recording apparatus includes a printing reception member 139 that is a sheet guide member guiding each paper sheet 113 sent from the conveyance roller 134 below the heads 124. The guide range of the printing reception member 139 corresponds to the movement range of the carriage 123 in the primary scanning direction. On the downstream side of the printing reception member 139 in the direction in which each paper sheet 113 is conveyed, the ink-jet recording apparatus includes a conveyance roller 141 and a spur 142 rotated to send each paper sheet 113 in a direction to eject each paper sheet 113, and further includes an ejection roller 143 and a spur 144 for sending out each paper sheet 113 onto the paper ejection tray 116 and guide members 145 and 146 forming a paper ejection path through which each paper sheet 113 is conveyed to be ejected.

At the time of recording, the heads 124 are driven in accordance with an image signal with the carriage 123 being moved. Thereby, ink is ejected onto the stationary paper sheet 113 so that recording is performed for one line. Then, after the paper sheet 113 is conveyed a predetermined distance, recording is performed for the next line. When a recording end signal or a signal indicating that the trailing edge of the paper sheet 113 has reached the recording region is received, the recording operation is terminated so that the paper sheet 113 is ejected. In this case, since each of the ink-jet heads of the present invention forming the heads 124 has improved controllability of ink droplet ejection, thereby suppressing variation in its characteristic, the ink-jet recording apparatus can record a stable high-quality image.

Further, the ink-jet recording apparatus includes a recovery part 147 for recovering from ejection failure in the heads 124. The recovery part 147 is provided on the $X_1$ side in the moving directions of the carriage 123 in a position outside the recording region as shown in FIG. 24. The recovery part 147 includes a capping part, a suction part, and a cleaning part. While waiting for printing, the carriage 123 is moved to the recovery part (147) side so as to have the heads 124 capped by the capping part. Thereby, the ink ejection openings of the heads 124 are maintained in a moist state, so that ejection failure due to drying is prevented. Further, during a recording operation, ink irrelevant to the recording is ejected so that all the ink ejection openings have the same ink viscosity, thereby maintaining a stable ejection characteristic.

In the case of the occurrence of ejection failure, the ink ejection openings (nozzles 5) of the heads 124 are hermetically sealed by the capping part, and air bubbles as well as ink are evacuated from the ink ejection openings through a tube by the suction part. Ink or dust adhering to the ink ejection surface of each head 124 is removed by the cleaning part. Thereby, the heads 124 recover from ejection failure. The evacuated ink is ejected to a waste ink reservoir (not shown in the drawings) provided in a lower part of the main body 111. In the waste ink reservoir, the waste ink is absorbed and kept in an ink absorbing body.

Thus, the ink-jet recording apparatus of this embodiment includes the ink-jet heads of the present invention. Therefore, the difference between the time constant of the case of driving one channel and the time constant of the case of driving all channels can be reduced, so that a stable high-quality image can be recorded.

In the above-described embodiments, the present invention is applied to an ink-jet head as a liquid droplet ejecting head. However, the present invention is also applicable to liquid droplet ejecting heads other than the ink-jet head, such as a liquid droplet ejecting head ejecting droplets of a liquid resist and a liquid droplet ejecting head ejecting droplets of a DNA sample.

Further, in the above-described embodiments, the present invention is applied to the actuator part (pressure generating part), as a piezoelectric actuator, of a liquid droplet ejecting head such as an ink-jet head. However, the present invention is also applicable to a microswitch (a micro relay), an actuator for a multi-optical lens (an optical switch), a micro flow meter, and a pressure sensor as well as a micropump and an optical device (an optical modulator).

Further, in the above-described embodiments, the present invention is applied to a side-shooter head in which the direction in which a diaphragm is displaced is equal to the direction in which an ink droplet is ejected. However, the present invention is also applicable to an edge-shooter head in which the direction in which a diaphragm is displaced is perpendicular to the direction in which an ink droplet is ejected.

The present invention is not limited to the specifically disclosed embodiments, but variations and modifications may be made without departing from the scope of the present invention.

The present application is based on Japanese priority application No. 2002-047371 filed on Feb. 25, 2002, the entire contents of which are hereby incorporated by reference.

The invention claimed is:

1. A layered piezoelectric element comprising:
a plurality of driving parts divided by grooves, the driving parts comprising alternate layers of piezoelectric layers and internal electrodes; and
non-driving parts formed at both ends of an array of said driving parts, the non-driving parts comprising the alternate layers of the piezoelectric layers and the internal electrodes,
wherein a common electrode of said driving parts is extended from said non-driving parts; and
a difference between a time constant of a driving voltage applied to the layered piezoelectric element in a case of driving all of said driving parts and a time constant of a driving voltage applied to the layered piezoelectric element in a case of driving one of said driving parts is smaller than or equal to 2 μsec.

2. A piezoelectric actuator comprising:
a movable part; and
a layered piezoelectric element performing said movable part, the layered piezoelectric element comprising:
- a plurality of driving parts divided by grooves, the driving parts comprising alternate layers of piezoelectric layers and internal electrodes; and
- non-driving parts formed at both ends of an array of said driving parts, the non-driving parts comprising the alternate layers of the piezoelectric layers and the internal electrodes,
- wherein a common electrode of said driving parts is extended from said non-driving parts; and
- a difference between a time constant of a driving voltage applied to the layered piezoelectric element in a case of driving all of said driving parts and a time constant a driving voltage applied to the layered piezoelectric element in a case of driving one of said driving parts is smaller than or equal to 2 μsec.

3. A liquid droplet ejecting head comprising:
a piezoelectric actuator pressurizing a liquid chamber communicating with a nozzle so as to eject a liquid droplet from the nozzle, the piezoelectric actuator comprising a layered piezoelectric element,
the layered piezoelectric element comprising:
- a plurality of driving parts divided by grooves, the driving parts comprising alternate layers of piezoelectric layers and internal electrodes; and
- non-driving parts formed at both ends of an array of said driving parts, the non-driving parts comprising the alternate layers of the piezoelectric layers and the internal electrodes,
- wherein a common electrode of said driving parts is extended from said non-driving parts; and
a difference between a time constant of a driving voltage applied to the layered piezoelectric element in a case of driving all of said driving parts and a time constant of a driving voltage applied to the layered piezoelectric element in a case of driving one of said driving parts is smaller than or equal to 2 μsec.

4. An ink-jet recording apparatus comprising:
an ink-jet head ejecting an ink droplet,
the ink-jet head comprising a piezoelectric actuator pressurizing a liquid chamber communicating with a nozzle so as to eject the ink droplet from the nozzle, the piezoelectric actuator comprising a layered piezoelectric element,
the layered piezoelectric element comprising:
- a plurality of driving parts divided by grooves, the driving parts comprising alternate layers of piezoelectric layers and internal electrodes; and
- non-driving parts formed at both ends of an array of said driving parts, the non-driving parts comprising the alternate layers of the piezoelectric layers and the internal electrodes,
- wherein a common electrode or said driving parts is extended from said non-driving parts; and
- a difference between a time constant of a driving voltage applied to the layered piezoelectric element in a case of driving all of said driving parts and a time constant of a driving voltage applied to the layered piezoelectric element in a case of driving one of said driving parts is smaller than or equal to 2 μsec.

5. An ink-jet recording apparatus comprising:
an ink-jet head,
the ink-let head comprising a layered piezoelectric element pressurizing a liquid chamber so as to eject an ink droplet therefrom,
the layered piezoelectric element comprising:
- a plurality of driving parts divided by grooves, the driving parts comprising alternate layers of piezoelectric layers and internal electrodes; and
- non-driving parts formed at both ends of an any of said driving parts, the non-driving parts comprising the alternate layers of the piezoelectric layers and the internal electrodes,
- wherein a common electrode of said driving parts is extended from said non-driving parts; and
- a difference between a time constant of a driving voltage applied to the layered piezoelectric element in a case of driving all of said driving parts and a time constant of a driving voltage applied to the layered piezoelectric element in a case of driving one of said driving parts is smaller than or equal to 2 μsec.

6. A layered piezoelectric element comprising:
a plurality of driving parts divided by grooves, the driving parts Comprising alternate layers of piezoelectric layers and internal electrodes;
non-driving parts formed at both ends of an array of said driving parts, the non-driving parts comprising the alternate layers of the piezoelectric layers and the internal electrodes; and
an internal electrode for conduction connected to a common external electrode of said driving parts and undivided by the grooves,
wherein a common electrode of said driving parts is extended from said non-driving parts.

7. The layered piezoelectric element as claimed in claim 6, wherein said internal electrode for conduction has a shape substantially equal to a shape that one of the internal electrodes of the alternate layers has before the alternate layers are grooved.

8. The layered piezoelectric clement as claimed in claim 6, wherein said internal electrode for conduction is formed in a plurality of layers.

9. The layered piezoelectric element as claimed in claim 8, wherein each of the layers of said internal electrode for conduction has a shape substantially equal to a shape that one of the internal electrodes of the alternate layers has before the alternate layers are grooved.

10. A piezoelectric actuator comprising:
a movable part; and
a layered piezoelectric element deforming said movable part,
the layered piezoelectric element comprising:
- a plurality of driving parts divided by grooves, the driving parts comprising alternate layers of piezoelectric layers and internal electrodes;
- non-driving parts formed at both ends of an array of said driving parts, the non-driving parts comprising the alternate layers of the piezoelectric layers and the internal electrodes; and
- an internal electrode for conduction connected to a common external electrode of said driving parts and undivided by the grooves,
- wherein a common electrode of said driving parts is extended from said non-driving parts.

11. The piezoelectric actuator as claimed in claim 10, wherein said internal electrode fur conduction has a shape substantially equal to a shape that one of the internal electrodes of the alternate layers has before the alternate layers are grooved.

12. The piezoelectric actuator as claimed in claim 10, wherein said internal electrode for conduction is formed in a plurality of layers.

13. The piezoelectric actuator as claimed in claim 12, wherein catch of the layers of said internal electrode for conduction has a shape substantially equal to a shape that one of the internal electrodes of the alternate layers has before the alternate layers are grooved.

14. A liquid droplet ejecting head comprising:
a piezoelectric actuator pressurizing a liquid chamber communicating with a nozzle so as to eject a liquid droplet from the nozzle, the piezoelectric actuator comprising a layered piezoelectric element,
the layered piezoelectric element comprising:
a plurality of driving parts divided by grooves, the driving parts comprising alternate layers of piezoelectric layers and internal electrodes;
non-driving parts formed at both ends of an array of said driving parts, the non-driving parts comprising the alternate layers of the piezoelectric layers and the internal electrodes; and
an internal electrode for conduction connected to a common external electrode of said driving parts and undivided by the grooves,
wherein a common electrode of said driving parts is extended from said non-driving parts.

15. The liquid droplet ejecting head as claimed in claim 14, wherein said internal electrode for conduction has a shape substantially equal to a shape that one of the internal electrodes of the alternate layers has before the alternate layers are grooved.

16. The liquid droplet ejecting head as claimed in claim 14, wherein said internal electrode for conduction is formed in a plurality of layers.

17. The liquid droplet ejecting head as claimed in claim 16, wherein each of the layers of said internal electrode for conduction has a shape substantially equal to a shape that one of the internal electrodes of the alternate layers has before the alternate layers are grooved.

18. An ink-jet recording apparatus comprising:
an ink-jet head ejecting an ink droplet,
the ink-jet head comprising a piezoelectric actuator pressurizing a liquid chamber communicating with a nozzle so as to eject the ink droplet from the nozzle, the piezoelectric actuator comprising a layered piezoelectric element,
the layered piezoelectric element comprising:
a plurality of driving parts divided by grooves, the driving parts comprising alternate layers of piezoelectric layers and internal electrodes;
non-driving parts formed at both ends of an array of said driving parts, the non-driving parts comprising the alternate layers of the piezoelectric layers and the internal electrodes; and
an internal electrode for conduction connected to a common external electrode of said driving parts and undivided by the grooves,
wherein a common electrode of said driving parts is extended from said non-driving parts.

19. The ink-jet recording apparatus as claimed in claim 18, wherein said internal electrode for conduction has a shape substantially equal to a shape that one of the internal electrodes of the alternate layers has before the alternate layers are grooved.

20. The ink-jet recording apparatus as claimed in claim 18, wherein said internal electrode for conduction is formed in a plurality of layers.

21. The ink-jet recording apparatus as claimed in claim 20, wherein each of the layers of said internal electrode for conduction has a shape substantially equal to a shape that one of the internal electrodes of the alternate layers has before the alternate layers.

22. A layered piezoelectric element comprising:
a plurality of driving parts divided by grooves, the driving parts comprising alternate layers of piezoelectric layers and internal electrodes;
non-driving parts formed at both ends of an array of said driving parts, the non-driving parts comprising the alternate layers of the piezoelectric layers and the internal electrodes; and
an external electrode for conduction connected to a common external electrode of said driving parts, the external electrode for conduction being formed on a stance of the layered piezoelectric layer which surface is undivided by the grooves,
wherein a common electrode of said driving parts is extended from said non-driving parts.

23. A piezoelectric actuator comprising:
a movable part; and
a layered piezoelectric element deforming said movable part,
the layered piezoelectric element comprising:
a plurality of driving parts divided by grooves, the driving parts comprising alternate layers of piezoelectric layers and internal electrodes;
non-driving parts formed at both ends of an array of said driving parts, the non-driving parts comprising the alternate layers of the piezoelectric layers and the internal electrodes: and
an external electrode for conduction connected to a common external electrode of said driving parts, the external electrode for conduction being formed on a surface of the layered piezoelectric layer which surface is undivided by the grooves,
wherein a common electrode of said driving parts is extended from said non-driving parts.

24. A liquid droplet ejecting head comprising:
a piezoelectric actuator pressurizing a liquid chamber communicating with a nozzle so as to eject a liquid droplet from the nozzle, the piezoelectric actuator comprising a layered piezoelectric element,
the layered piezoelectric element comprising:
a plurality of driving parts divided by grooves, the driving parts comprising alternate layers of piezoelectric layers and internal electrodes;
non-driving parts formed at both ends of an array of said driving parts, the non-driving parts comprising the alternate layers of the piezoelectric layers and the internal electrocles; and
an external electrode for conduction connected to a common external electrode of said driving parts, the external electrode for conduction being formed on a surface of the layered piezoelectric layer which surface is undivided by the grooves,
wherein a common electrode of said driving parts is extended from said non-driving parts.

25. An ink-jet recording apparatus comprising:
an ink-jet head ejecting an ink droplet,
the ink-jet head comprising a piezoelectric actuator pressurizing an ink chamber communicating with a nozzle so as to eject the ink droplet from the nozzle, the piezoelectric actuator comprising a layered piezoelectric element, the layered piezoelectric element comprising:
- a plurality of driving parts divided by grooves, the driving parts comprising alternate layers of piezoelectric layers and internal electrodes;
- non-driving parts formed at both ends of an array of said driving parts, the non-driving parts comprising the alternate layers of the piezoelectric layers and the internal electrodes: and
- an external electrode for conduction connected to a common external electrode of said driving parts, the external electrode for conduction being formed on a surface of the layered piezoelectric layer which surface is undivided by the grooves,
- wherein a common electrode of said driving parts is extended from said non-driving parts.

26. A method of manufacturing a layered piezoelectric element including a plurality of driving parts divided by grooves, non-driving parts formed at both ends of an array of the driving parts, and an internal electrode for conduction connected to a common external electrode of the driving parts and undivided by the grooves, the driving parts and the non-driving parts comprising alternate layers of piezoelectric layers and internal electrodes, the driving parts having a common electrode extended from the non-driving parts, the method comprising the steps of:
  (a) fixing a member including a dummy part to a base, the dummy part being formed of a piezoelectric layer to have a shape substantially symmetrical to a shape of a group of the internal electrodes of the alternate layers in a direction in which the alternate layers are formed; and
  (b) removing the dummy part from the member.

27. The method us claimed in claim 26, wherein a dummy internal electrode corresponding to the internal electrode for conduction is formed in the dummy part.

28. The method as claimed in claim 27, wherein the dummy internal electrode has a shape symmetrical to a shape that one of the internal electrodes of the alternate layers has before the alternate layers are grooved, the one of the internal electrodes being closest to a surface of the member after the dummy part is removed therefrom, the surface of the member being created by removing the dummy part.

29. The method as claimed in claim 27, wherein the dummy internal electrode has a shape substantially symmetrical to a shape that a first one of the internal electrodes of the alternate layers has before the alternate layers are grooved, the first one of the internal electrodes alternating with a second one of the internal electrodes of the alternate layers, the second one of the internal electrodes being closest to a surface of the member after the dummy part is removed therefrom, the surface of the member being created by removing the dummy part. are grooved.

* * * * *